US010199099B2

(12) United States Patent
Hori et al.

(10) Patent No.: US 10,199,099 B2
(45) Date of Patent: Feb. 5, 2019

(54) SEMICONDUCTOR MEMORY DEVICE

(71) Applicant: Toshiba Memory Corporation, Tokyo (JP)

(72) Inventors: Megumu Hori, Yokohama Kanagawa (JP); Yoshihisa Iwata, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/694,547

(22) Filed: Sep. 1, 2017

(65) Prior Publication Data
US 2018/0277201 A1 Sep. 27, 2018

(30) Foreign Application Priority Data

Mar. 22, 2017 (JP) .................................. 2017-056352

(51) Int. Cl.
G11C 11/34 (2006.01)
G11C 16/04 (2006.01)
G11C 13/00 (2006.01)

(52) U.S. Cl.
CPC ........ *G11C 13/004* (2013.01); *G11C 13/0028* (2013.01)

(58) Field of Classification Search
CPC ............ G11C 13/0069; G11C 13/0007; G11C 16/0483; G11C 16/08; G11C 16/10; G11C 11/412; G11C 13/004; G11C 5/063; G11C 7/065; G11C 11/417; G11C 11/419; G11C 16/0466; G11C 16/06; G11C 16/16
See application file for complete search history.

(56) References Cited

U.S. PATENT DOCUMENTS 7,177,181 B1 2/2007 Scheuerlein
7,457,142 B2 * 11/2008 Nitta .................... G11C 7/1027
 365/214
8,310,858 B2 11/2012 Ito
(Continued)

FOREIGN PATENT DOCUMENTS

JP 5284225 B2 9/2013

OTHER PUBLICATIONS

Ran Sahar et al., A 4b/Cell 8Gb NROM Data-Storage Memory with Enhanced Write Performance, IEEE International Solid-State Circuits Conference, Session 23, Non-Volatile Memory, 23.2, 2008, Digest of Technical Papers, pp. 422-423 and p. 624.

*Primary Examiner* — Hien Nguyen
(74) *Attorney, Agent, or Firm* — Patterson & Sheridan, LLP

(57) ABSTRACT

A semiconductor memory device includes a first memory cell having a first end connected to a first wiring and a second end connected to a second wiring and a second memory cell having a first end connected to the first wiring and a second end connected to a third wiring. A sense amplifier is configured to: sense a first current flowing in the first wiring when a first voltage is applied to the second and third wirings and a second voltage, larger than the first voltage, is applied to the first wiring; and sense a second current flowing in the first wiring when a third voltage larger than the second voltage is applied to the first wiring, the first voltage to the second wiring, and the second voltage to the third wiring. The sense amplifier reads data according to a difference between the first current and the second current.

20 Claims, 20 Drawing Sheets

(56) References Cited

U.S. PATENT DOCUMENTS

| | | |
|---|---|---|
| 8,422,270 B2 | 4/2013 | Kawabata et al. |
| 8,456,887 B2 | 6/2013 | Iwata |
| 9,704,562 B2 * | 7/2017 | Onuki ................. G11C 11/4091 |
| 2006/0203607 A1 * | 9/2006 | Takatsuka ................ G11C 8/18 |
| | | 365/233.5 |
| 2009/0052235 A1 * | 2/2009 | Horii ................... G11C 11/5678 |
| | | 365/163 |
| 2010/0195370 A1 * | 8/2010 | Shiimoto ............ G11C 13/0011 |
| | | 365/148 |
| 2012/0236636 A1 * | 9/2012 | Nawata ................. G11C 16/28 |
| | | 365/185.2 |

* cited by examiner

FIG. 10

|  | SAO1 | SAO2 | SAO3 |
|---|---|---|---|
| "R" LEVEL | L | L | L |
| "S1" LEVEL | H | L | L |
| "S2" LEVEL | H | H | L |
| "S3" LEVEL | H | H | H |

SEMICONDUCTOR MEMORY DEVICE

CROSS-REFERENCE TO RELATED APPLICATION

This application is based upon and claims the benefit of priority from Japanese Patent Application No. 2017-056352, filed Mar. 22, 2017, the entire contents of which are incorporated herein by reference.

FIELD

Embodiments described herein relate generally to a semiconductor memory device.

BACKGROUND

There is known a semiconductor memory device having a resistance-variable element.

DESCRIPTION OF THE DRAWINGS

FIG. 10 is a table for describing read data in the reading operation of the semiconductor memory device according to the first embodiment.

DETAILED DESCRIPTION

Figure 1:
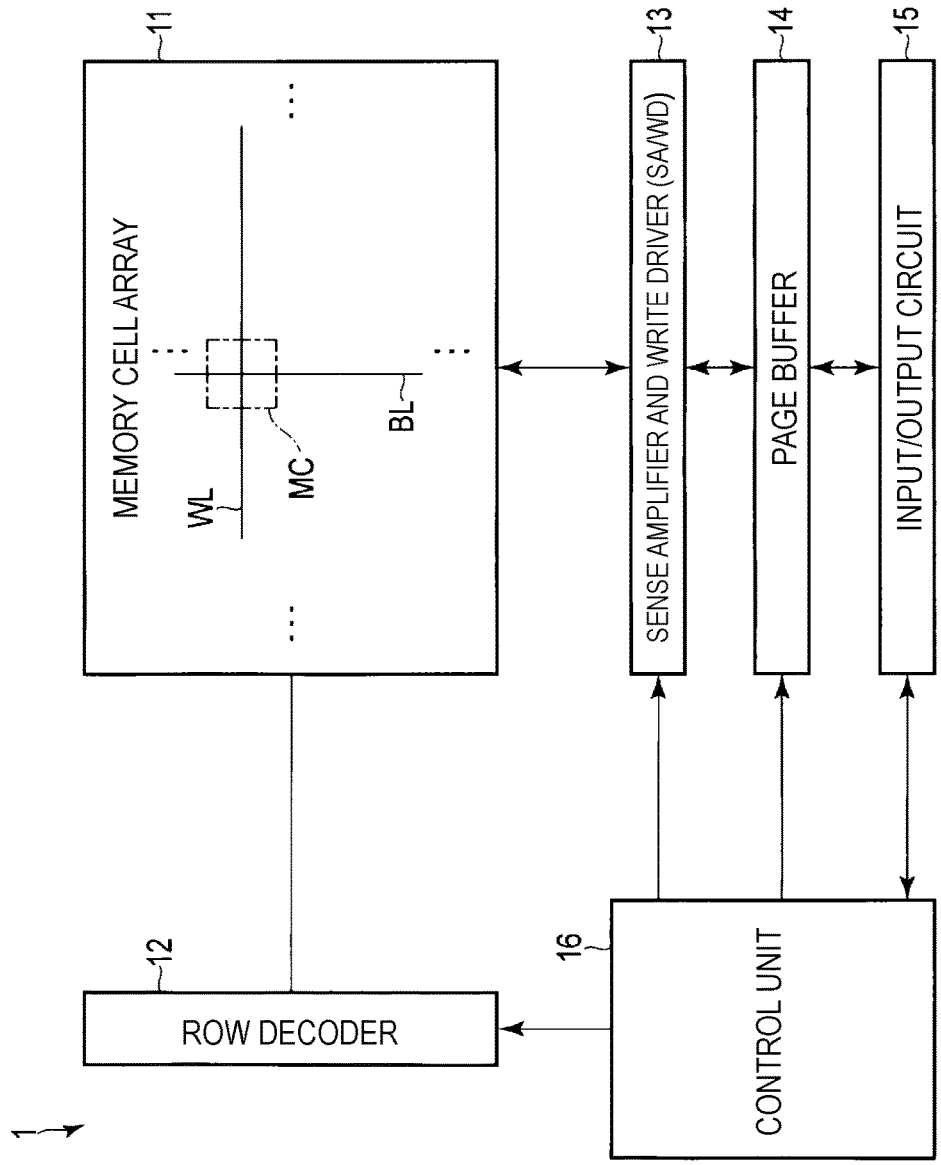
FIG. 1 is a block diagram of a semiconductor memory device according to a first embodiment.

In some example embodiments, data of a selected memory cell can be read while reducing an influence of a semi-selected memory cell.

A semiconductor memory device of an embodiment includes a first memory cell, a second memory cell, and a sense amplifier. The first memory cell has a first end electrically connected to a first wiring and a second end electrically connected to a second wiring. The second memory cell has a first end electrically connected to the first wiring and a second end electrically connected to a third wiring. The sense amplifier is configured to sense a first current and a second current and read data from the first memory cell according to a difference between the first current and the second current. The first current flows in the first wiring when a first voltage is applied to the second and third wirings and a second voltage larger than the first voltage is applied to the first wiring. The second current flows in the first wiring when a third voltage larger than the second voltage is applied to the first wiring, the first voltage is applied to the second wiring, and the second voltage is applied to the third wiring.

Hereinafter, example embodiments will be described with reference to drawings. Further, in the following description, common reference numerals are given to components having the same function and configuration. Furthermore, when multiple instances of an otherwise substantially similar component with a common reference numeral are to be distinguished from each other in depiction or description, additional indexing subscripts are attached to the common reference numeral to distinguish these components. In addition, in cases where these multiple instances of components do not need to be particularly distinguished from each other, then only the common reference numeral is used for these components and no additional indexing subscript is attached thereto.

1. First Embodiment

A semiconductor memory device according to a first embodiment will be described. In the semiconductor memory device according to the first embodiment, a resistance-variable element is used as a memory element. As described above, as the semiconductor memory device having the resistance-variable element, for example, a resistive random access memory (ReRAM), a phase-change random access memory (PCRAM), and the like are known.

1.1 Configuration

First, the configuration of the semiconductor memory device according to the first embodiment will be described.

1.1.1 Configuration of Semiconductor Memory Device

FIG. 1 is a block diagram for describing a configuration of a semiconductor memory device 1 according to a first embodiment. As illustrated in FIG. 1, the semiconductor memory device 1 includes a memory cell array 11, a row decoder 12, a sense amplifier and write driver (SA/WD) 13, a page buffer 14, an input/output circuit 15, and a control unit 16.

The memory cell array 11 includes memory cells MC in corresponding rows and columns. The memory cells MC in the same row are connected to the same word line WL and ends of the memory cells MC in the same column are connected to the same bit line BL. The bit line BL includes, for example, a local bit line and a global bit line. Each memory cell MC includes a resistance-variable element. The resistance-variable element serves as a memory storage device in which data can be stored according to a change in a resistance state thereof and holding the data written thereto in a nonvolatile manner, and allowing the written data to be read.

The row decoder 12 is connected to the memory cell array 11 via word lines WL. The row decoder 12 decodes a row address designating a row (or rows) of the memory cell array 11. Then, the row decoder 12 selects word lines WL according to a decoding result and a voltage required for operations such as writing and reading of data is supplied to the selected word lines WL.

The SA/WD 13 is connected to the memory cell array 11 via bit lines BL. The SA/WD 13 supplies the voltage to an operation target memory cell MC of via the bit lines BL to perform data writing and data reading for the memory cell MC. More specifically, a write driver WD of the SA/WD 13 writes data in the memory cell MC. Further, a sense amplifier SA in the SA/WD 13 performs data reading from the memory cell MC.

The page buffer 14 temporarily holds the data to be written in the memory cell array 11 and the data read from the memory cell array 11 in data units called pages.

The input/output circuit 15 transmits various signals received from the outside of the semiconductor memory device 1 to the control unit 16 and the page buffer 14, and transmits various kinds of information from the control unit 16 and the page buffer 14 to the outside of the semiconductor memory device 1.

The control unit 16 is connected with the row decoder 12, the SA/WD 13, the page buffer 14, and the input/output circuit 15. The control unit 16 controls the row decoder 12, the SA/WD 13, and the page buffer 14 according to various signals received by the input/output circuit 15 from the outside of the semiconductor memory device 1.

1.1.2 Stacking Configuration of Memory Cell Array

Figure 2:
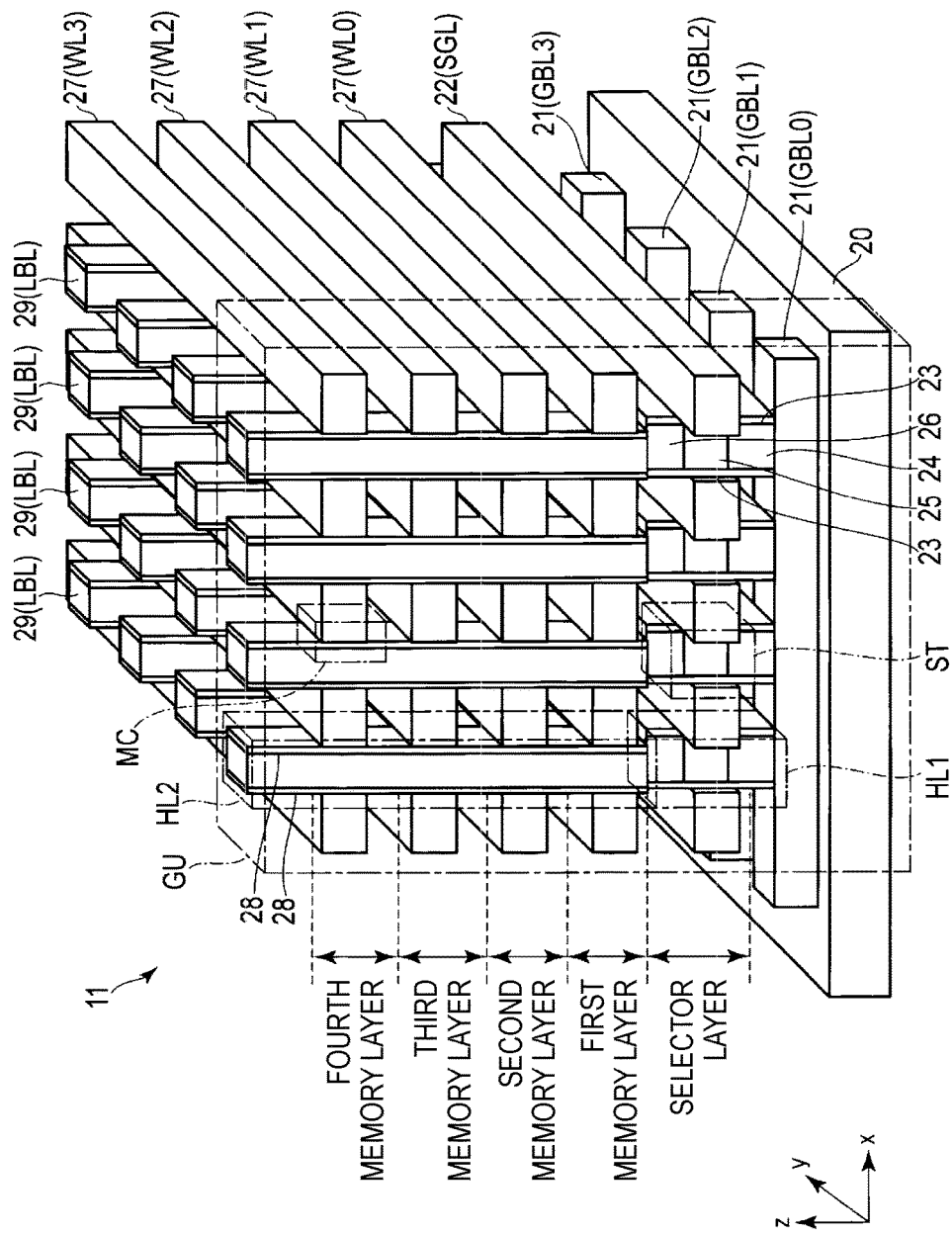
FIG. 2 is a perspective view of a memory cell array of the semiconductor memory device according to the first embodiment.

FIG. 2 is a perspective view for describing a 3D structure (stacking configuration) of a memory cell array of the semiconductor memory device 1 according to the first embodiment. In the following description, a plane parallel to an upper surface of a semiconductor substrate is defined as a xy plane and an axis normal to the xy plane is defined as a z axis. The x and y axes are defined as axes perpendicular to each other, for example in the xy plane.

As illustrated in FIG. 2, the memory cell array 11 has a configuration in which memory cells MC are stacked in the z-axis direction on a semiconductor substrate 20. Wiring layers 21 are provided on the semiconductor substrate 20 to serve as global bit lines GBL (GBL0, GBL1, GBL2, GBL3 . . . ). The wiring layers 21 extend in, for example, the x-axis direction and are arranged in the y-axis direction.

A selector layer is provided on the wiring layers 21. The selector layer includes wiring layers 22 serving as gate lines SGL. The wiring layers 22 extend in, for example, the y-axis direction and are arranged in the x-axis direction. The wiring layers 22 are commonly connected to gates (gate nodes) of plural column transistors CT which are aligned along the y-axis direction. Insulating films (not specifically illustrated) are provided between the wiring layers 21 and 22, between the wiring layers 22, and on the wiring layers 22.

In a region where a column transistor CT is to be provided, a through via hole HL1 is formed in the z-axis direction. The through via hole HL1 is formed to have, for example, a prismatic shape including sides in the x-axis direction and sides in the y-axis direction and to reach the upper surface of the wiring layer 21 through a space between adjacent wiring layers 22. That is, the through via holes HL1 are arranged in a lattice pattern in the x-axis direction and the y-axis direction.

In addition, the wiring layers 22 are exposed on the lateral surfaces of the sides in the y-axis direction of the through via hole HL1. Blocking insulating films 23 are provided on the lateral surfaces of the sides in the y-axis direction of the through via hole HL1. That is, the block insulating films 23 are in contact with the wiring layers 22. In the through via hole HL1, a diffusion layer 24, a channel layer 25, and a diffusion layer 26 are sequentially stacked to bury the through via hole HL1. The diffusion layers 24 and 26 include, for example, carriers, and serve as a source or a drain of the column transistor CT. The channel layer 25 is, for example, non-doped polysilicon, and serves as a channel of the column transistor CT. Such a column transistor CT serves as, for example, a vertical transistor having a current path in the z-axis direction.

On the selector layer, a first memory layer, a second memory layer, a third memory layer, and a fourth memory layer are sequentially stacked. Each of the first to fourth memory layers includes plural wiring layers 27 that serve as word lines WL0 to WL4, respectively. The wiring layers 27 extend in, for example, the y-axis direction, and are arranged in the x-axis direction. The wiring layers 27 are commonly connected to a first ends of the memory cells MC aligned along the y-axis direction in the same memory layer. Insulating films (not specifically illustrated) are provided between the wiring layers 27. The number of memory layers is not limited to four, and a predetermined number of layers may be stacked.

A through via hole HL2 is formed in the z-axis direction in a region where a local bit line LBL and a memory cell MC are scheduled to be provided. The through via hole HL2 is formed to have, for example, the prismatic shape including the sides in the x-axis direction and the sides in the y-axis direction and to reach the upper surface of the diffusion layer 26 through the space between adjacent wiring layers 27 in the same memory layer. That is, the through via holes HL2 are arranged in the lattice pattern in the x-axis direction and the y-axis direction. The through via holes HL1 and HL2 are formed, for example, at the same positions in the xy plane.

The wiring layers 27 are exposed on the lateral surfaces of the sides in the y-axis direction of the through via hole HL2. Element layers 28 are respectively provided on the lateral surfaces of the sides in the y-axis direction of the through via hole HL2. That is, the element layers 28 are in contact with the wiring layers 27. A wiring layer 29 serving as the local bit line LBL is buried in the through via hole HL2. A part of an element layer 28 sandwiched between a wiring layer 27 and a wiring layer 29 serves as one memory cell MC.

With the above configuration, memory cells MC are provided in a lattice pattern in the same memory cell layer and stacked in the z-axis direction. In addition, the memory cell array 11 has a cross-point type structure in which memory cells MC are respectively provided in intersection regions between word lines WL and local bit lines LBL.

In the following description, for simplicity, a configuration unit including memory cells MC provided on one wiring layer 21 will be referred to as a global unit GU.

Figure 3:
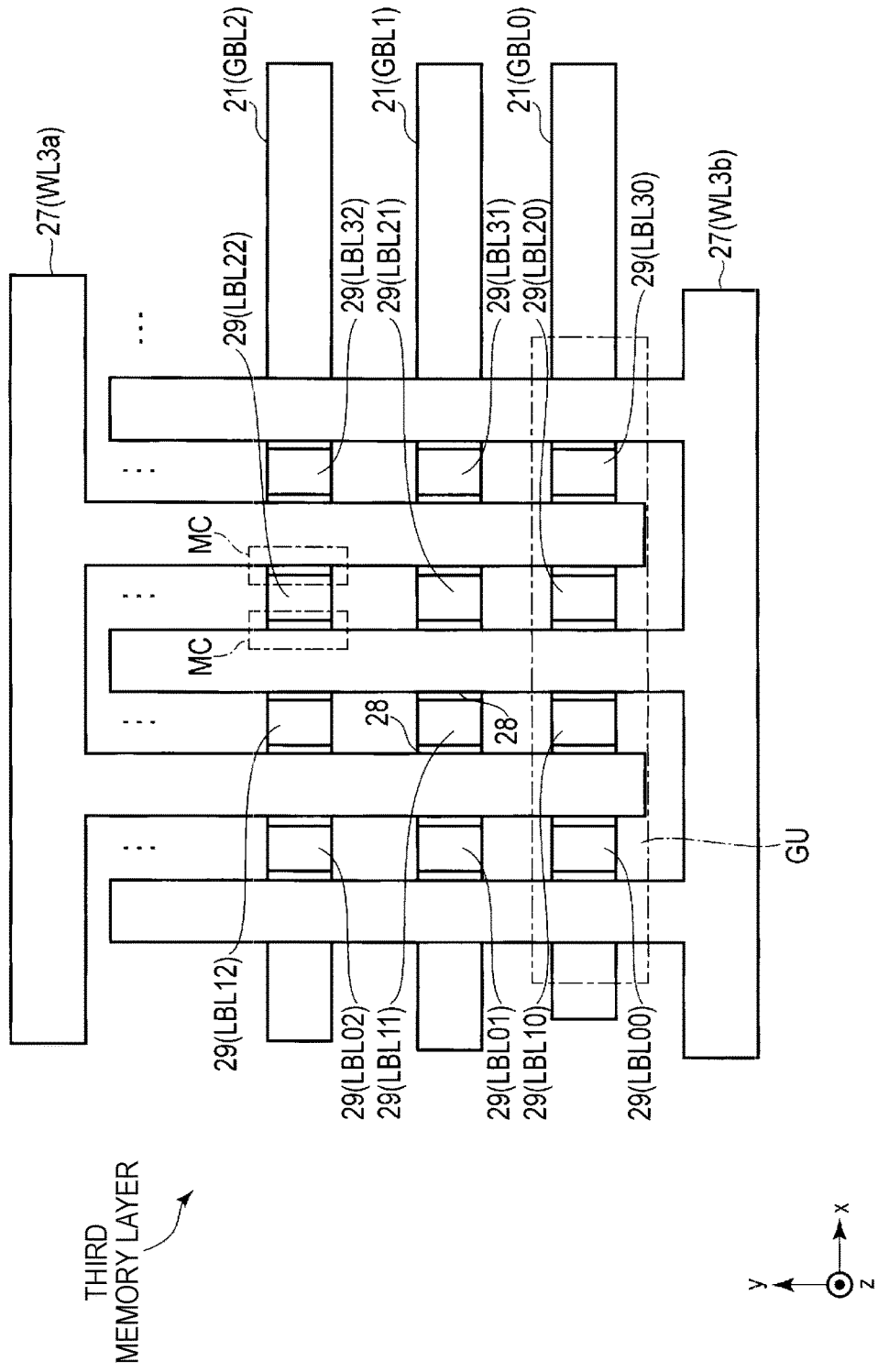
FIG. 3 is a plan view of the memory cell array of the semiconductor memory device according to the first embodiment.

Next, the configuration obtained in the case of looking down the memory cell array 11 described in FIG. 2 in the z-axis direction will be described with reference to FIG. 3. FIG. 3 is a plan view of the memory cell array of the semiconductor memory device according to the first embodiment, which is viewed down in the z-axis direction. In FIG. 3, to simplify the illustration, the illustration of insulating films is omitted.

As illustrated in FIG. 3, plural wiring layers 29 are provided above one wiring layer 21 extending in the x-axis direction. In the example of FIG. 3, the wiring layers 29 ((LBL00, LBL10, LBL20, LBL30 . . . ), (LBL01, LBL11, LBL21, LBL31 . . . ), and (LBL02, LBL12, LBL22, LBL32 . . . )) are provided above the wiring layers 21 (GBL0 to GBL2).

In the same memory layer (the fourth memory layer in the example of FIG. 3), an element layer 28 has a first end connected to a wiring layer 27 and a second end connected to a side in the y-axis direction of a wiring layer 29. That is, in the same memory layer, a wiring layer 29 is connected to two memory cells MC.

The wiring layers 27 include two wiring layer sets each provided in a comb shape in the same memory layer. In the example of FIG. 3, the even-numbered wiring layers 27 along the x-axis direction are commonly connected by a wiring layer extending in the x-axis direction in the +y-axis direction region from the wiring layers 21 so as to constitute one (the word line set WL3a) of the two wiring layer sets. Further, the odd-numbered wiring layers 27 in the x-axis direction are commonly connected by a wiring layer extending in the x-axis direction in the −y-axis direction region from the wiring layers 21 so as to constitute the other one (the word line set WL3b) of the two wiring layer sets.

With the above configuration, it is possible to select a predetermined memory cell MC by selecting a predetermined local bit line LBL and a predetermined word line set WL.

1.1.3 Circuit Configuration of Memory Cell Array

Figure 4:
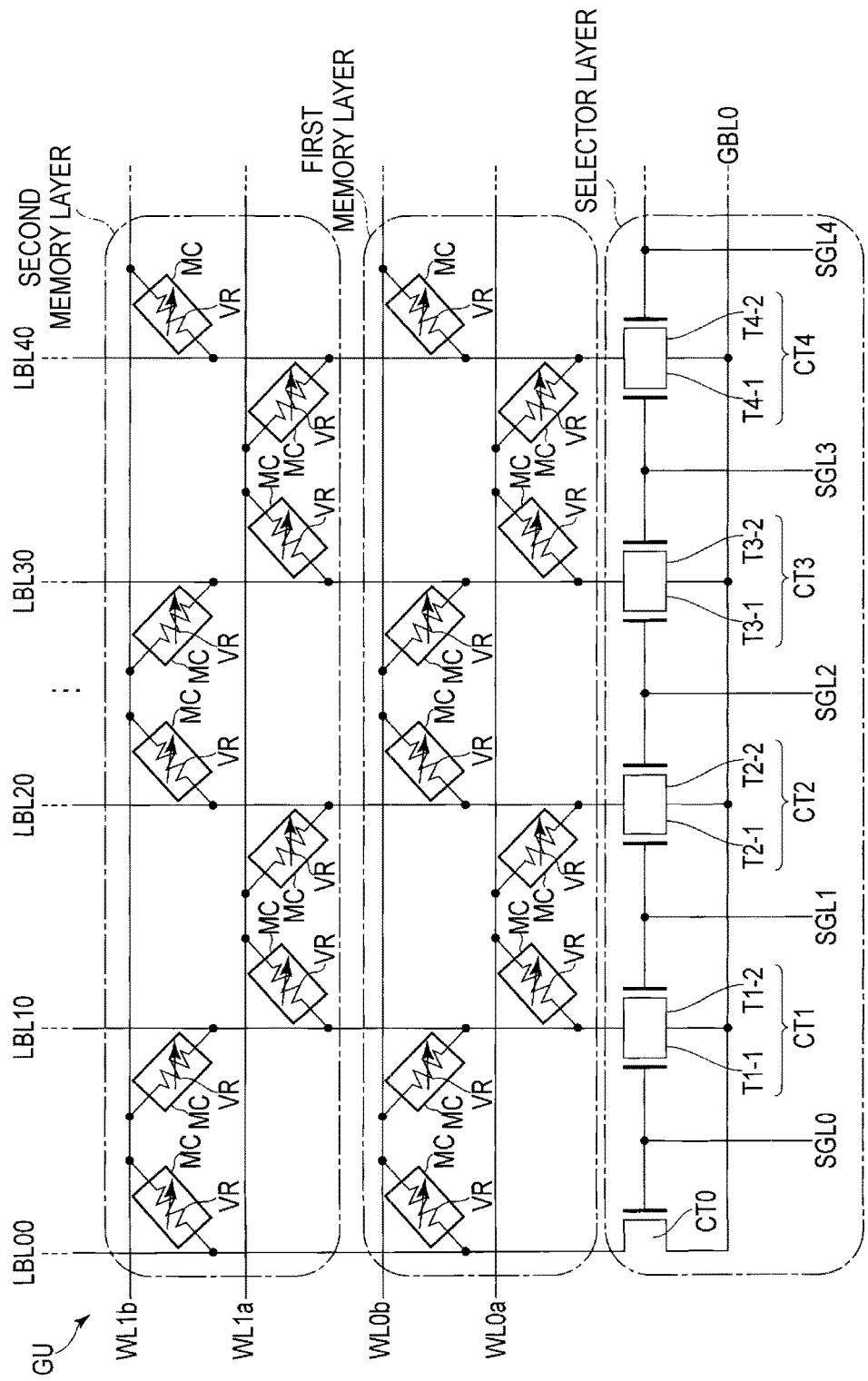
FIG. 4 is a circuit diagram of the semiconductor memory device according to the first embodiment.

Subsequently, a circuit configuration of the memory cell array of the semiconductor memory device according to the first embodiment will be described. FIG. 4 is a circuit diagram for describing a circuit configuration of the memory cell array of the semiconductor memory device 1 according to the first embodiment. In FIG. 4, the circuit configuration of a part of the global unit GU connected to the global bit line GBL0 is illustrated. That is, in FIG. 4, the circuit configurations of, in particular, first and second memory layer parts in the global unit GU are illustrated.

As illustrated in FIG. 4, the word line sets WL0a and WL0b are provided in the first memory layer and word line sets WL1a and WL1b are provided in the second memory layer. Further, column transistors CT (CT0, CT1, CT2, CT3, and CT4) are provided in the selector layer. The column transistors CT1 to CT4 each include two transistors, transistors T1-1 and T1-2, transistors T2-1 and T2-2, transistors T3-1 and T3-2, and transistors T4-1 and T4-2, respectively.

The gates of the column transistor CT0 and the transistor T1-1, the gates of the transistors T1-2 and T2-1, the gates of the transistors T2-2 and T3-1, and the gates of the transistors T3-2 and T4-1 are commonly connected to gate lines SGL0 to SGL3, respectively. The gate of the transistor T4-2 is connected to a gate line SGL4.

The first ends of the respective column transistors CT0 to CT4 are commonly connected to the global bit line GBL0. The second ends of the respective column transistors CT0 to CT4 are connected to the local bit lines LBL00, LBL10, LBL20, LBL30, and LBL40, respectively.

Each memory cell MC corresponds to the crossing of one local bit line LBL and one word line set WL. That is, each memory cell MC includes a first end connected to a predetermined word line set WL and a second end connected to a predetermined local bit line LBL. Each memory cell MC includes a resistance-variable element VR. The resistance-variable element VR has, for example, a nonlinear resistance characteristic. In addition, the resistance-variable element VR has a function of switching a resistance value between a low resistance state and a high resistance state, for example, by supplying a voltage thereto.

1.1.4 Cell Current Distribution of Memory Cell

Figure 5:
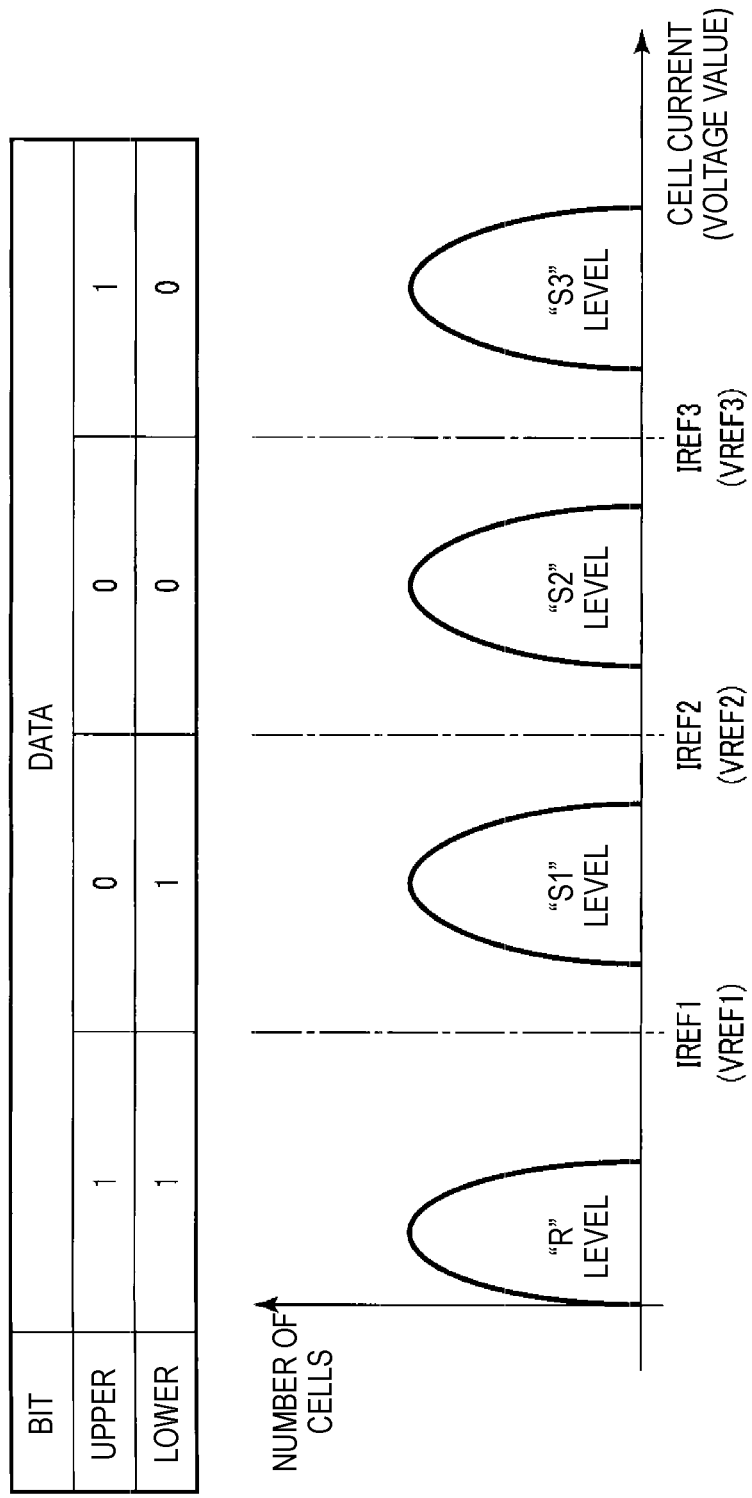
FIG. 5 is a diagram for describing a cell current distribution of a memory cell of the semiconductor memory device according to the first embodiment.

Next, a distribution of cell current magnitudes which may be taken by a memory cell will be described with reference to FIG. 5. FIG. 5 is a schematic view illustrating an example of a distribution of current (cell current) which flows when a voltage having a predetermined magnitude is supplied to the memory cell of the semiconductor memory device according to the first embodiment. Further, FIG. 5 illustrates an example of a case (multi level cell (MLC)) where 2-bit data is stored in one memory cell MC.

As illustrated in FIG. 5, the memory cell MC may hold 2-bit data based on an upper bit (upper data) and a lower bit (lower data), that is, "11", "01", "10", and "00" data according to the magnitude of the cell current may be stored.

The cell current of the memory cell MC of the "11" data is at a "reset (R)" level, and corresponds to, for example, a data erase state. In addition, the cell current of the memory cell MC included in the "R" level is smaller than current IREF.

The cell currents of the memory cells MC of "01", "10", and "00" data are at "S1 (Set 1)", "S2 (Set 2)" and "S3 (Set 3)" levels, respectively. The "S1" level to the "S3" level correspond to, for example, a state in which the resistance value of the memory cell MC is changed due to the supply of the voltage to the element layer 28. The cell current of the memory cell MC, which is included in the "S1" level, is larger than current IREF1 and smaller than current IREF2. The cell current of the memory cell MC, which is included in the "S2" level, is larger than the current IREF2 and smaller than current IREF3. The cell current of the memory cell MC, which is included in the "S3" level, is larger than the current IREF3. Further, the currents IREF1 to IREF3 may be set to predetermined values within a range to maintain a relationship of IREF1<IREF2<IREF3.

As described above, the memory cell MC has any one of four cell current distributions to take four types of states. Further, a relationship between each piece of data and a threshold level maybe appropriately changed rather than being limited to the above relationship.

FIG. 5 and the cell current distributions may be read as voltage value distributions obtained by converting the cell current into the voltage. A voltage value corresponding to a cell current may be calculated, for example, as a voltage value of a capacitor charged for a predetermined time by the predetermined cell current. When FIG. 5 is read as the voltage value distributions, the voltage value of the memory cell MC, which is included in the "R" level, is smaller than voltage VREF1. The voltage value of the memory cell MC, which is included in the "S1" level, is larger than the voltage VREF1 and smaller than voltage VREF2. The voltage value of the memory cell MC, which is included in the "S2" level, is larger than the voltage VREF2 and smaller than voltage VREF3. The voltage value of the memory cell MC, which is included in the "S3" level, is larger than the voltage VREF3. Further, the voltages VREF1 to VREF3 may be set to predetermined values within a range to maintain a relationship of VREF1<VREF2<VREF3.

1.1.5 Configuration of Sense Amplifier

Figure 6:
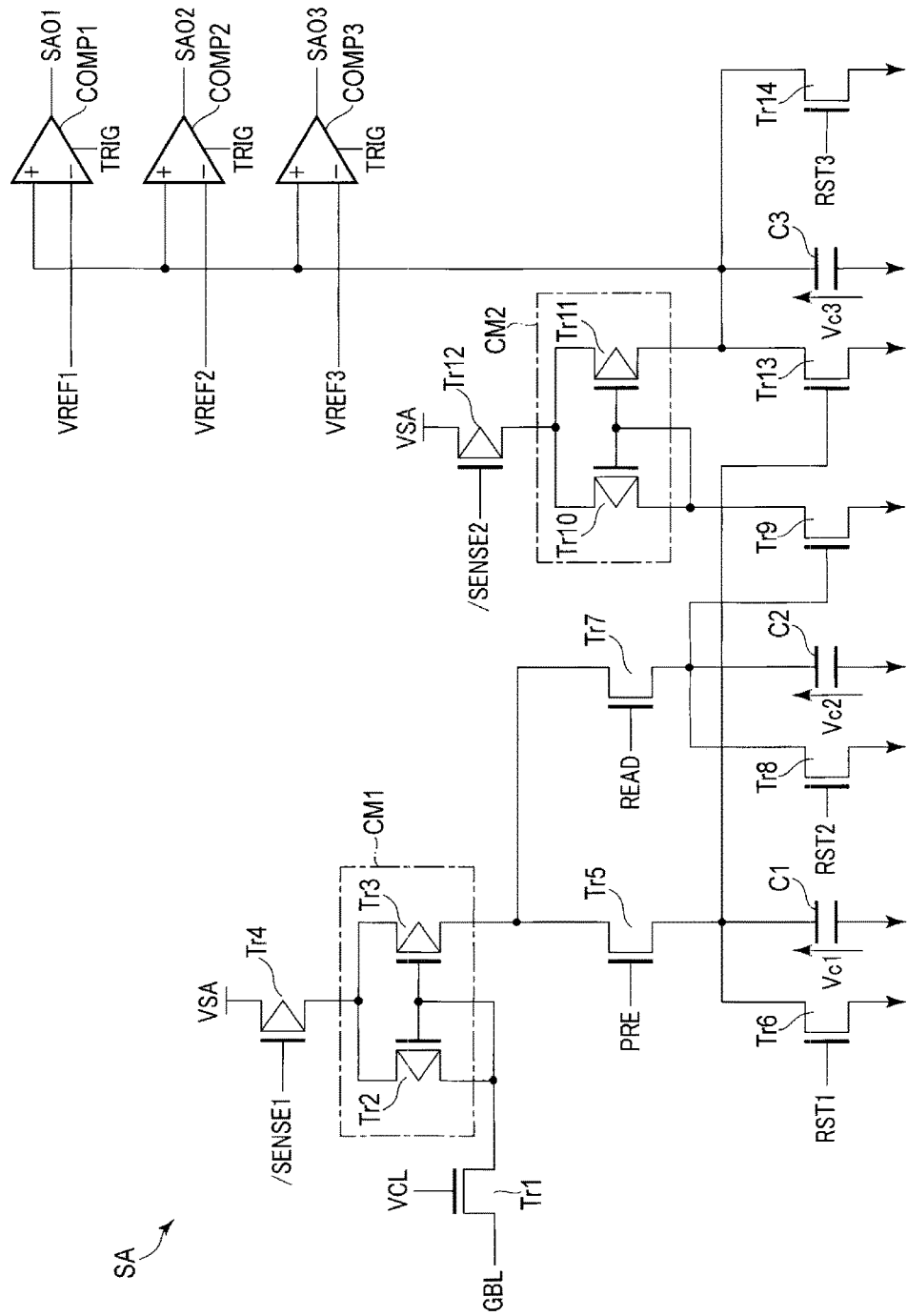
FIG. 6 is a circuit diagram of a sense amplifier of the semiconductor memory device according to the first embodiment.

Subsequently, the configuration of the sense amplifier of the semiconductor memory device according to the first embodiment will be described. FIG. 6 is a circuit diagram for describing the configuration of a sense amplifier SA of the semiconductor memory device according to the first embodiment.

As illustrated in FIG. 6, the sense amplifier SA includes transistors Tr1, Tr2, Tr3, Tr4, Tr5, Tr6, Tr7, Tr8, Tr9, Tr10, Tr11, Tr12, Tr13, and Tr14, capacitors C1, C2, and C3, and comparators COMP1, COMP2, and COMP3.

The transistor Tr1 has a threshold voltage Vth and includes a first end connected to the global bit line GBL and a gate supplied with a signal VCL. The signal VCL controls the value of the voltage supplied from the sense amplifier SA to the global bit line GBL. Specifically, for example, the transistor Tr1 transmits a voltage V0 to the first end of the transistor Tr1 when a voltage (Vth+V0) that is larger than the threshold voltage Vth by a predetermined value V0 is supplied to the signal VCL.

The second end of the transistor Tr1, the first end and the gate of the transistor Tr2, and the gate of the transistor Tr3 are commonly connected.

The second end of the transistor Tr2, the first end of the transistor Tr3, and the first end of the transistor Tr4 are commonly connected.

The transistor Tr4 includes a second end to which a power source VSA is supplied and a gate to which a signal /SENSE1 is supplied. The power source VSA is, for example, 5 V to 6 V, and is larger than the voltage supplied to the signal VCL.

The second end of the transistor Tr3, the first end of the transistor Tr5, and the first end of the transistor Tr7 are commonly connected.

The transistors Tr2 and Tr3 constitute, for example, a current mirror circuit CM1 including a first end connected to the second end of the transistor Tr1 and a second end commonly connected to the first end of the transistor Tr5 and the first end of the transistor Tr7.

The transistor Tr5 includes a gate to which a signal PRE is supplied.

The second end of the transistor Tr5, the first end of the transistor Tr6, the first end of the capacitor C1, and the gate of the transistor Tr13 are commonly connected.

The transistor Tr6 includes a grounded second end and a gate to which a signal RST1 is supplied.

The capacitor C1 includes the grounded second end and the voltage of the first end for the second end is determined according to a charge amount Vc1.

The transistor Tr7 includes a gate to which a signal READ is supplied.

The second end of the transistor Tr7, the first end of the transistor Tr8, the first end of the capacitor C2, and the gate of the transistor Tr9 are commonly connected.

The transistor Tr8 includes a grounded second end and a gate to which a signal RST2 is supplied.

The capacitor C2 includes the grounded second end and the voltage of the first end for the second end is determined according to a charge amount Vc2.

The first end of the transistor Tr9, the first end and the gate of the transistor Tr10, and the gate of the transistor Tr11 are commonly connected.

The second end of the transistor Tr9 is grounded.

The second end of the transistor Tr10, the first end of the transistor Tr11, and the first end of the transistor Tr12 are commonly connected.

The second end of the transistor Tr11, the first end of the transistor Tr13, the first end of the transistor Tr14, the first end of the capacitor C3, a first input end of the comparator COMP1, the first input end of the comparator COMP2, and the first input end of the comparator COMP3 are commonly connected.

The transistors Tr10 and Tr11 constitute, for example, a current mirror circuit CM2 including the first end connected to the first end of the transistor Tr9, and the second end commonly connected to the first end of the transistor Tr13, the first end of the transistor Tr14, the first end of the capacitor C3, and the first input end of each of the comparators COMP1 to COMP3.

The transistor Tr12 includes a first end to which the power source VSA is supplied and a gate to which a signal /SENSE2 is supplied.

The second end of the transistor Tr13 is grounded.

The capacitor C3 includes the grounded second end and the voltage of the first end for the second end is determined according to a charge amount Vc3.

The transistor Tr14 includes a grounded second end and a gate to which a signal RST3 is supplied.

Each of the comparators COMP1 to COMP3 is driven by a signal TRIG and includes a second input end to which the powers VREF1 to VREF3 is supplied and an output end to which one of signals SAO1 to SAO3 is supplied. Each of the comparators COMP1 to COMP3 compares the voltage input to the first input end with the voltage input to the second input end, and outputs the result of the comparison to the output end. Specifically, each of the comparators COMP1 to COMP3 outputs an "H" level when the voltage input to the first input end is larger than the voltage input to the second input end, and outputs an "L" level when the voltage input to the first input end is smaller than the voltage input to the second input end.

1.2 Operation

Subsequently, an operation of the semiconductor memory device according to the first embodiment will be described.

1.2.1 Selection of Memory Cell

Subsequently, a state in which a memory cell in the semiconductor memory device according to the first embodiment is selected in a reading operation will be described.

In the following description, a memory cell MC to be read in the reading operation is called a selected memory cell MC to be distinguished from the other memory cells MC.

A local bit line LBL and a word line set WL connected to the selected memory cell MC will be referred to as a selected local bit line LBL and a selected word line WL, respectively. A column transistor CT of which the first end is connected to the selected local bit line LBL, a global bit line GBL connected to the second end of the column transistor CT, and a gate line SGL connected to the gate of the column transistor CT will be referred to as a selected column transistor CT, a selected global bit line GBL, and a select gate line SGL, respectively.

The other unselected local bit lines LBL, word line sets WL, column transistors CT, global bit lines GBL, and gate lines SGL will be referred to as unselected memory cells MC, unselected local bit lines LBL, unselected word lines WL, unselected column transistors CT, unselected global bit lines GBL, and unselected gates lines SGL, respectively.

The memory cells MC other than the selected memory cell MC include, for example, a semi-selected memory cell MC and an unselected memory cell MC. The semi-selected memory cell MC is defined as, for example, a memory cell MC including a first end connected to the selected local bit line LBL and a second end connected to an unselected word line WL. The unselected memory cell MC is defined as, for example, a memory cell MC including, for example, a first end connected to an unselected local bit line LBL. The definitions of "selected", "semi-selected", and "unselected" are not strictly limited to these above definitions and instead some other a definition may be adopted.

Figure 7:
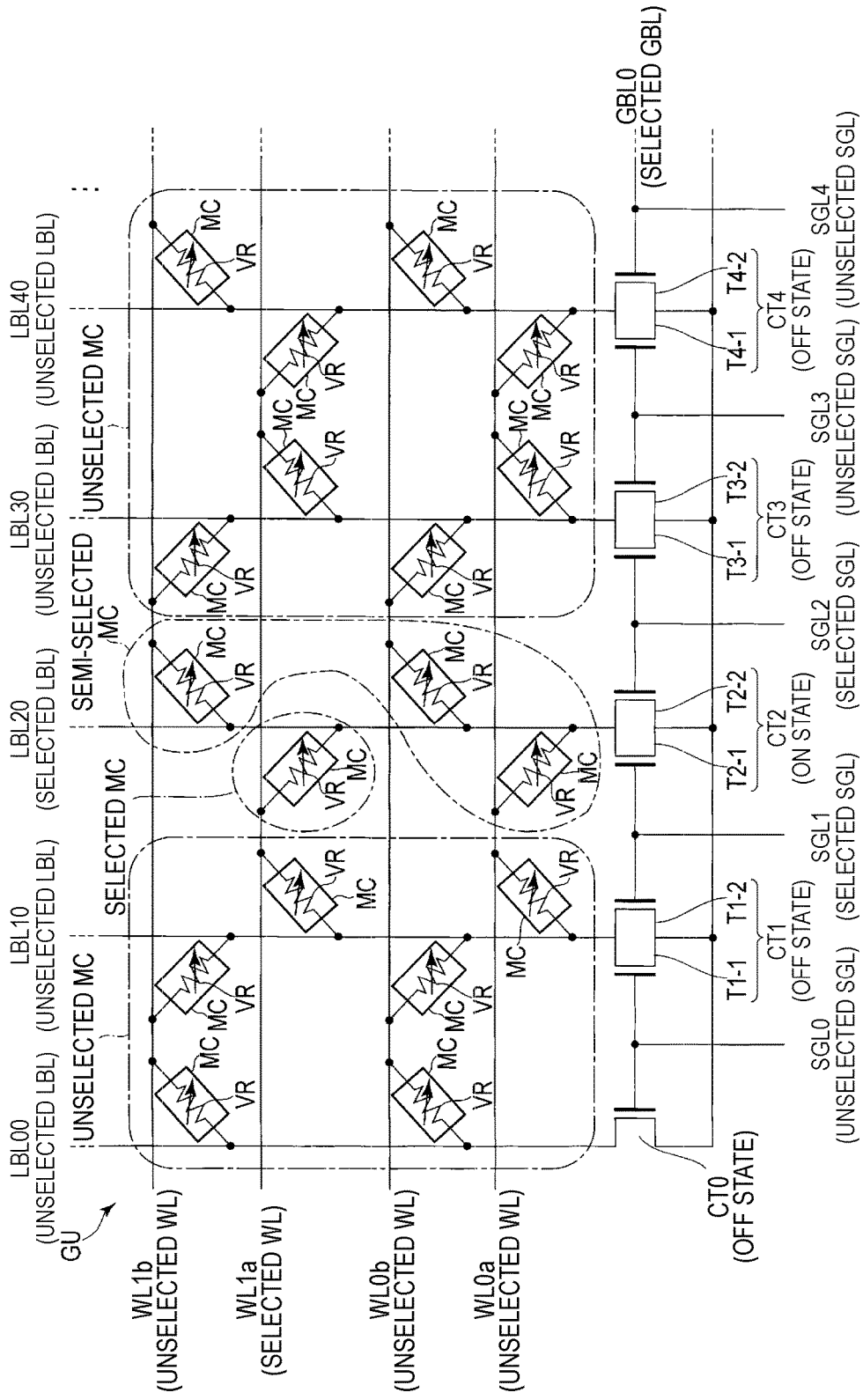
FIG. 7 is a schematic view for describing a selected state of the memory cell at the time of reading of the semiconductor memory device according to the first embodiment.

However, here the selection state of the memory cell MC based on the above definitions will be specifically described with reference to FIG. 7. FIG. 7 is a schematic view for describing a selected state of a memory cell in reading the semiconductor memory device according to the first embodiment. FIG. 7 illustrates an example in which a global bit line GBL0 is selected as the selected global bit line GBL and a word line WL1a is selected as the selected word line WL. That is, in the example of FIG. 7, global bit lines GBL (not specifically illustrated) other than the global bit line GBL0 is the unselected global bit lines GBL. Further, the column transistors CT, the local bit lines LBL, and the memory cells MC connected to the unselected global bit lines GBL are the unselected column transistors CT, the unselected local bit line LBLs, and the unselected memory cells MC, respectively. In addition, the word lines WL other than the word line WL1a are the unselected word lines WL.

As illustrated in FIG. 7, when the selected gate lines SGL1 and SGL2 are selected, the transistors T1-2, T2-1, T2-2, and T2-2 go into an on state. As a result, all of the transistors in the column transistor CT2 go into an on state and the local bit line LBL20 is selected. That is, the selected local bit line LBL20 is electrically connected to the selected global bit line GBL0.

One selected memory cell MC and multiple semi-selected memory cells MC are connected to the selected local bit line LBL20. Specifically, among the memory cells MC connected to the selected local bit line LBL20, the memory cell MC connected to the selected word line WL1a is the selected memory cell MC and the memory cells MC connected to the unselected word lines WL0a, WL0b, and WL1b are the semi-selected memory cell MC.

Since the unselected gate lines SGL0 and SGL4 are not selected, the column transistor CT0 and the transistors T1-1, T3-2, T4-1, and T4-2 are turned off. As a result, all of the transistors in the column transistors CT0 and CT4 go into an off state and the local bit lines LBL00 and LBL40 are unselected. That is, the unselected local bit lines LBL00 and LBL40 are electrically disconnected from the selected global bit line GBL0.

In the case of the column transistors CT1 and CT3, one of two transistors goes into an on state and the other one goes into an off state. For this reason, in the column transistors CT1 and CT3, a sufficient channel is not formed for performing the reading operation (the column transistors CT1 and CT3 go into an off state). Accordingly, it can be said that the local bit lines LBL10 and LBL30 are electrically connected to the selected global bit line GBL0, but the local bit lines LBL10 and LBL30 are unselected.

The memory cell MC connected to the unselected local bit lines LBL00, LBL10, LBL30, and LBL40 becomes the unselected memory cell MC.

As described above, in the reading operation, all of the memory cells MC are classified into any one of selected memory cell MC, semi-selected memory cell MC, and unselected memory cell MC.

1.2.2 Details of Reading Operation

Figure 8:
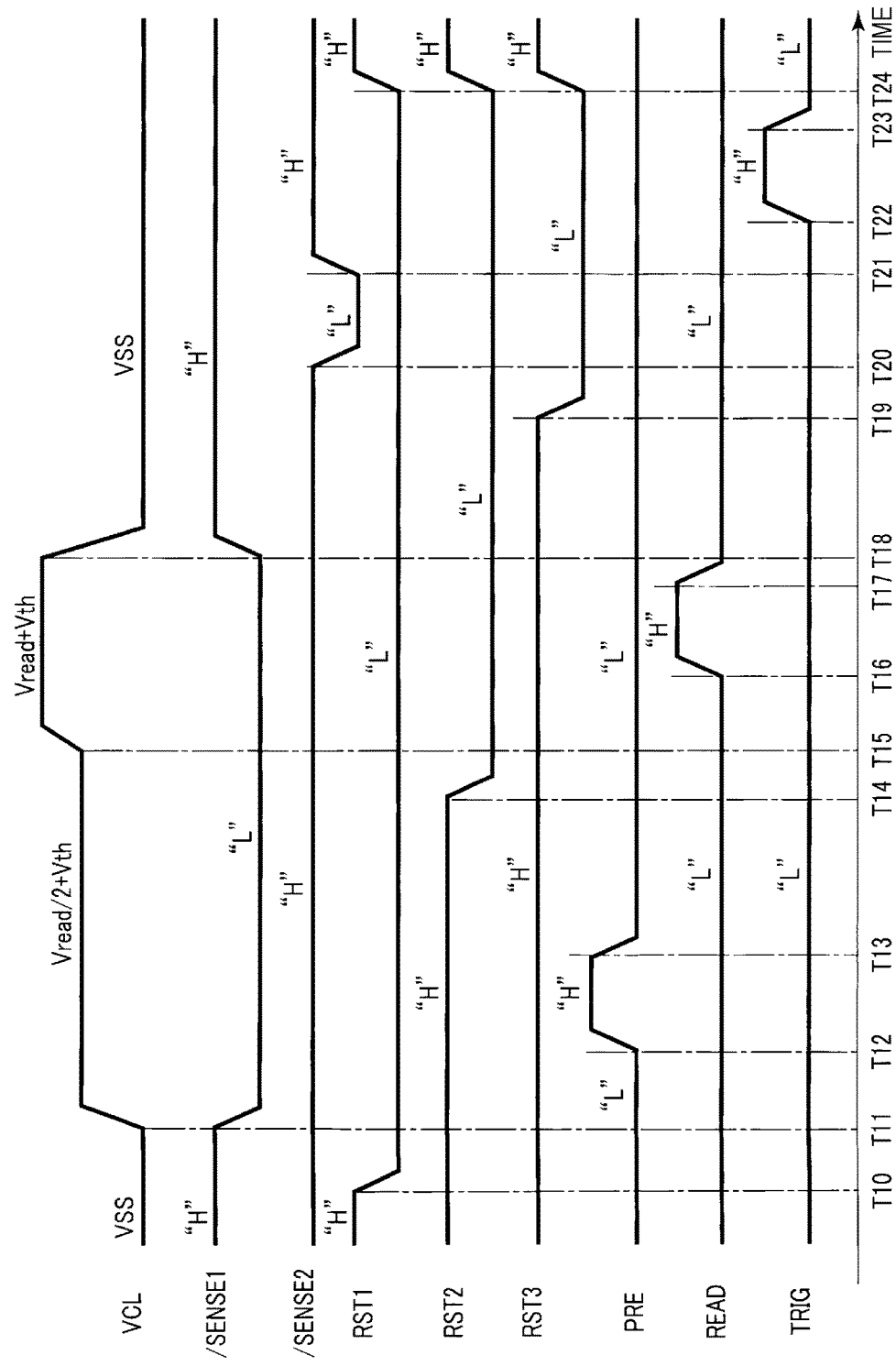
FIG. 8 is a timing chart for describing a reading operation of the semiconductor memory device according to the first embodiment.
Figure 9:
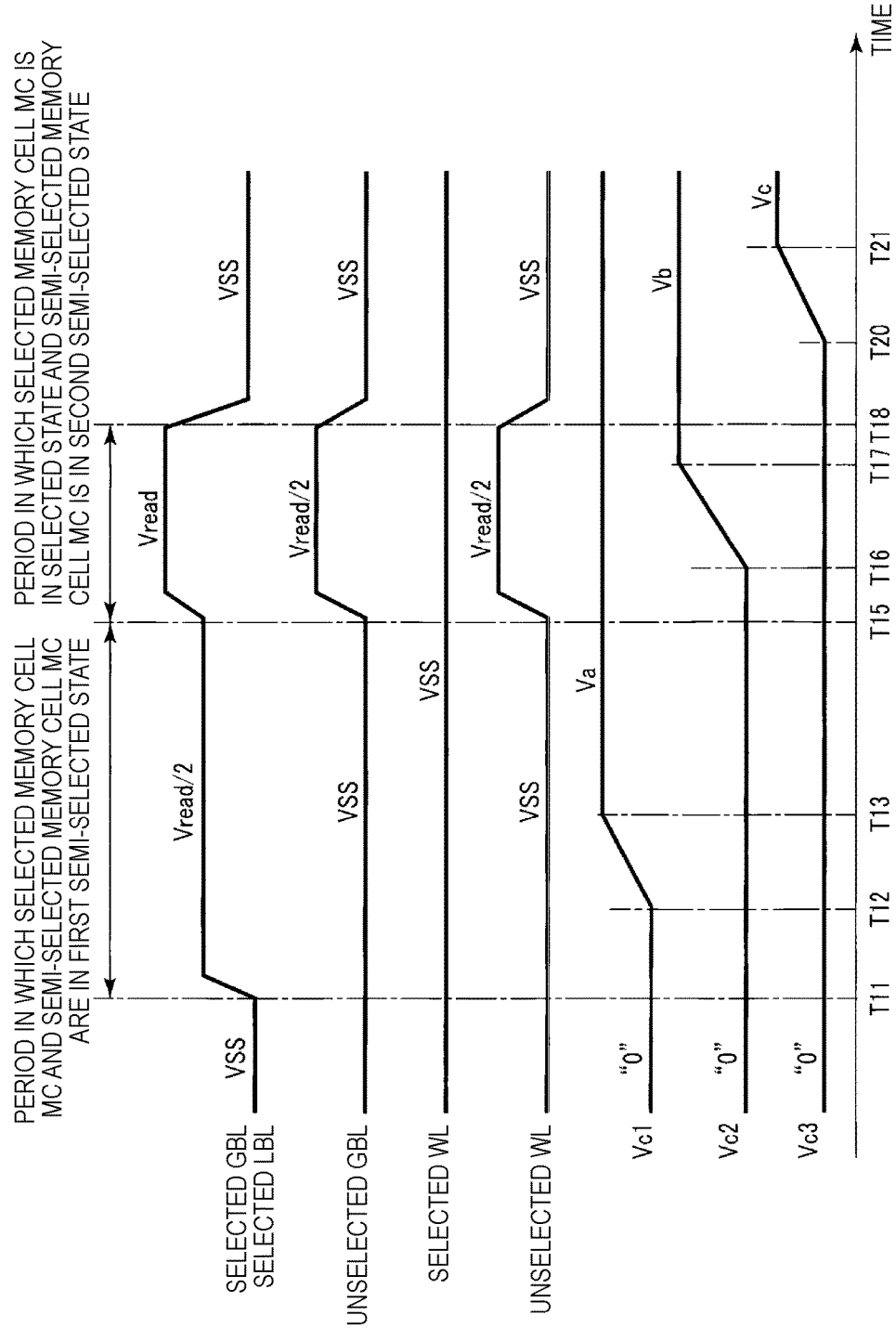
FIG. 9 is a timing chart for describing the reading operation of the semiconductor memory device according to the first embodiment.

Subsequently, the reading operation of the semiconductor memory device according to the first embodiment will be described with reference to FIGS. 8 to 10. FIG. 8 is a timing chart for describing a state of a signal input to the sense amplifier in the reading operation of the semiconductor memory device according to the first embodiment. FIG. 9 is a timing chart for describing states of a voltage supplied to various wirings and a voltage charged in a capacitor in the reading operation of the semiconductor memory device according to the first embodiment. FIG. 10 is a table for describing a relationship between an input and an output of a comparator in the reading operation of the semiconductor memory device according to the first embodiment.

First, details of the operations of the sense amplifier SA in the reading operation will be described with reference to FIG. 8.

As illustrated in FIG. 8, a voltage VSS is supplied to the signal VCL up to time T10. As a result, the current mirror circuit CM1 is electrically disconnected from the selected global bit line GBL. The voltage VSS is a ground voltage, for example, 0 V. Further, the "H" level is supplied to the signals /SENSE1 and /SENSE2. As a result, the transistors Tr4 and Tr12 go into an off state and the current mirror circuits CM1 and CM2 are electrically disconnected from the power source VSA. Further, the "L" level is supplied to the signals PRE and READ and the "H" level is supplied to the signals RST1, RST2, and RST3. As a result, the charging of the capacitors C1 to C3 is reset. Further, the "L" level is supplied to the signal TRIG. As a result, the comparators COMP1 to COMP3 are not driven.

At time T10, the "L" level is supplied to the signal RST1. As a result, the transistor Tr6 goes into an off state and the capacitor C1 goes into a chargeable state.

At time T11, a voltage (Vread/2+Vth) is supplied to the signal VCL and the "L" level is supplied to the signal /SENSE1. As a result, the current mirror circuit CM1 is electrically connected to the selected global bit line GBL and the power source VSA. Then, a voltage Vread/2 is supplied to the selected global bit line GBL and the sum of the cell currents flowing in the memory cell array 11 flows according to the voltage Vread/2. The current mirror circuit CM1 supplies a mirror current of the current flowing in the selected global bit line GBL to the first end of the transistor Tr5 and the first end of the transistor Tr7. The voltage Vread is a voltage supplied to the memory cell MC when reading the data of the memory cell MC, and is larger than the voltage VSS. The voltage Vread/2 is, for example, an intermediate value between the voltage Vread and the voltage VSS (Vread/2=(Vread+VSS)/2).

At time T12, the "H" level is supplied to the signal PRE and the transistor Tr5 goes into an on state. As a result, the capacitor C1 starts being charged by the mirror current from the current mirror circuit CM1.

At time T13, the "L" level is supplied to the signal PRE and the transistor Tr5 goes into an off state. As a result, the capacitor C1 is electrically disconnected from the current mirror circuit CM1, and as a result, the charging by the mirror current is terminated. As a result of charging the capacitor C1, a voltage depending on the charge amount Vc1 is transmitted to the gate of the transistor Tr13.

At time T14, the "L" level is supplied to the signal RST2. As a result, the transistor Tr8 goes into an off state and the capacitor C2 goes into a chargeable state.

At time T15, a voltage Vread+Vth is supplied to the signal VCL. As a result, the voltage Vread is supplied to the selected global bit line GBL, and the sum of the cell currents flowing in the memory cell array 11 flows according to the voltage Vread. The current mirror circuit CM1 supplies a mirror current of the current flowing in the selected global bit line GBL to the first end of the transistor Tr5 and the first end of the transistor Tr7.

At time T16, the "H" level is supplied to the signal READ and the transistor Tr7 goes into an on state. As a result, the capacitor C2 starts being charged by the mirror current from the current mirror circuit CM1.

At time T17, the "L" level is supplied to the signal READ and the transistor Tr7 goes into an off state. As a result, the capacitor C2 is electrically disconnected from the current mirror circuit CM1, and as a result, the charging by the mirror current is terminated. As a result of charging the capacitor C2, a voltage depending on the charge amount Vc2 is transmitted to the gate of the transistor Tr9.

At time T18, the voltage VSS is supplied to the signal VCL and the "H" level is supplied to the signal /SENSE1. As a result, the current mirror circuit CM1 is electrically disconnected from the selected global bit line GBL and the power source VSA.

At time T19, the "L" level is supplied to the signal RST3. As a result, the transistor Tr14 goes into an off state and the capacitor C3 goes into a chargeable state.

At time T20, the "L" level is supplied to the signal /SENSE2. As a result, the current mirror circuit CM2 is electrically connected with the power source VSA. Then, a current depending on the charge amount Vc2 of the capacitor C2 flows in the transistor Tr9. The current mirror circuit CM2 supplies the mirror current of the current flowing in the transistor Tr9 to the first end of the transistor Tr13 and the first end of the capacitor C3. A current depending on the charge amount Vc1 of the capacitor C1 flows in the transistor Tr13. That is, in the capacitor C3, charging is started by a current depending on a difference between the charge amount Vc2 and the charge amount Vc1.

At time T21, the "H" level is supplied to the signal /SENSE2. As a result, the current mirror circuit CM2 is electrically disconnected from the power source VSA to stop supplying mirror current. The charging of the capacitor C3 by the current depending on the difference between the charge amount Vc2 and the charge amount Vc1 is terminated. As a result of charging the capacitor C3, a voltage depending on the charge amount Vc3 is input to the first input ends of the comparators COMP1 to COMP3.

At time T22, the "H" level is supplied to the signal TRIG. As a result, the driving of the comparators COMP1 to COMP3 is started. The voltages VREF1 to VREF3 are input to the second input ends of the comparators COMP1 to COMP3, respectively, and the signals SAO1 to SAO3 are output from the output ends thereof. In addition, based on the signals SAO1 to SAO3, the data held in the selected memory cell MC is determined.

At time T23, the "L" level is supplied to the signal TRIG. As a result, the driving of the comparators COMP1 to COMP3 is stopped.

At time T24, the "H" level is supplied to the signals RST1 to RST3. As a result, the voltages charged in the capacitors C1 to C3 are reset.

The operations of the sense amplifier SA in the reading operation are now terminated.

Next, the details of the voltages supplied to the various wirings and the voltages of capacitors in the reading operation will be described with reference to FIG. 9. Herein, the time T11 to T21 illustrated in FIG. 9 corresponds to the time T11 to T21 illustrated in FIG. 8.

As illustrated in FIG. 9, the sense amplifier SA supplies the voltage VSS to the global bits line GBL and the local bit line LBL up to time T11. Further, the row decoder 12 supplies the voltage VSS to the word lines WL. For this reason, no current flows in all of the memory cells MC in the memory cell array 11. In addition, since the capacitors C1 to C3 are not charged, the charge amounts Vc1 to Vc3 are "0".

At time T11, the sense amplifier SA supplies the voltage Vread/2 to the selected global bit line GBL and the selected local bit line LBL. The row decoder 12 supplies the voltage VSS to the unselected global bit line GBL and all the word lines WL. Therefore, the voltage Vread/2 is supplied to a selected memory cell MC and semi-selected memory cells MC. As described above, the state in which the voltage Vread/2 is supplied to a memory cell MC is referred to as a "semi-selected state". Further, the state where the voltage Vread/2 is supplied to the memory cell MC by supplying the voltage Vread/2 to the first end of the memory cell MC and the voltage VSS to the second end is also referred to as a "first semi-selected state". No potential difference is generated across the unselected memory cells MC. As described above, a state in which the potential difference is not generated in the memory cell MC is referred to as an "unselected state".

That is, at time T11, the cell current in a first semi-selected state flows in all of the selected memory cell MC and the semi-selected memory cells MC. The unselected memory cells MC go into the unselected state and current having a minute magnitude may flow in the unselected memory cells MC, but a cell current having a significant magnitude as compared to the first semi-selected state does not flow in the unselected memory cells MC. The cell currents flowing in all of the memory cells MC are distributed from the sense amplifier SA to each memory cell MC via the selected global bit line GBL.

The capacitor C1 is charged according to the magnitude of the total cell current flowing in the selected memory cell MC and the semi-selected memory cell MC in the first semi-selected state from time T12 to time T13. As a result, the charge amount Vc1 of the capacitor C1 becomes a voltage Va.

At time T15, the sense amplifier SA supplies the voltage Vread to the selected global bit line GBL and the selected local bit line LBL and supplies the voltage Vread/2 to the unselected global bit line GBL. Further, the row decoder 12 supplies the voltage Vread/2 to the unselected word line WL. Therefore, the voltage Vread is supplied to the selected memory cell MC and the voltage Vread/2 is supplied to the semi-selected memory cells MC. As described above, the state in which the voltage Vread is supplied to the memory cell MC is referred to as the "selected state". Further, the semi-selected memory cells MC go into the semi-selected state. In addition, the state where the voltage Vread/2 is supplied to the memory cell MC by supplying the voltage Vread to the first end of the memory cell MC and the voltage Vread/2 to the second end is also referred to as a "second semi-selected state". No potential difference is continuously generated across the unselected memory cells MC.

That is, at time T15, the cell current in the selected state flows in the selected memory cell MC. In the semi-selected memory cells MC, the cell current flows in the second semi-selected state. The unselected memory cells MC go into the unselected state and current having a minute magnitude may flow in the unselected memory cells MC, but a cell current having a significant magnitude as compared with the selected state and the second semi-selected state does not flow in the unselected memory cells MC. The cell currents flowing in all of the memory cells MC are distributed from the sense amplifier SA to each memory cell MC via the selected global bit line GBL.

The cell current flowing in a memory cell MC in the first semi-selected state and the cell current flowing in a memory cell MC in the second semi-selected state may have approximately the same magnitude.

The capacitor C2 is charged according to the magnitude of the total cell current flowing in the selected memory cell MC in the selected state and the semi-selected memory cell MC in the second semi-selected state from time T16 to time T17. As a result, the charge amount Vc2 of the capacitor C2 becomes a voltage Vb. The voltage Vb is larger than the voltage Va.

At time T18, the sense amplifier SA supplies the voltage VSS to all the global bit lines GBL and the local bit lines LBL. Further, the row decoder 12 supplies the voltage VSS to all the word lines WL. As a result, the supply of the voltage to all the memory cells MC is stopped.

The capacitor C3 is charged according to a difference between the voltage Vb and the voltage Va from time T20 to time T21. As a result, the charge amount Vc3 of the capacitor C3 becomes a voltage Vc. That is, the voltage Vc becomes a value equal to or corresponding to a voltage (Vb−Va).

The voltage Vc obtained as described above is compared with the voltages VREF1 to VREF3 by the comparators COMP1 to COMP3, respectively. The comparators COMP1 to COMP3 output the signals SAO1 to SAO3, respectively to determine the level of the data written in the selected memory cell MC.

As illustrated in FIG. 10, when the voltage Vc is smaller than the voltage VREF1 (Vc<VREF1), the comparator COMP1 outputs the signal SAO1 at the "L" level and when the voltage Vc is larger than the voltage VREF1 (Vc>VREF1), the comparator COMP1 outputs the signal SAO1 at the "H" level. When the voltage Vc is smaller than the voltage VREF2 (Vc<VREF2), the comparator COMP2 outputs the signal SAO2 at the "L" level, and when the voltage Vc is larger than the voltage VREF2 (Vc>VREF2), the comparator COMP2 outputs the signal SAO2 at the "H" level. When the voltage Vc is smaller than the voltage VREF3 (Vc<VREF3), the comparator COMP3 outputs the signal SAO3 at the "L" level and when the voltage Vc is larger than the voltage VREF3 (Vc>VREF3), the comparator COMP3 outputs the signal SAO3 at the "H" level.

When all of the signals SAO1 to SAO3 are at the "L" level, it is determined that the selected memory cell MC is at the "R" level. When the signal SAO1 is at the "H" level and the signals SAO2 and SAO3 are at the "L" level, it is determined that the selected memory cell MC is at the "S1" level. When the signals SAO1 and SAO2 are at the "H" level and the SAO3 is at the "L" level, it is determined that the selected memory cell MC is at the "S2" level. When all of the signals SAO1 to SAO3 are at the "H" level, it is determined that the selected memory cell MC is at the "S3" level.

1.3 Effect According to First Embodiment

According to the first embodiment, the data of a selected memory cell may be read while reducing an influence of a semi-selected memory cell. Hereinafter, this effect will be described.

When reading data from the selected memory cell in the memory cell array configured with the memory cells including the resistance-variable elements, the cell current may simultaneously flow in the semi-selected memory cells as well, in addition to the selected memory cell. Therefore, at the time of reading the data, the cell current flowing 1n the semi-selected memory cells may become noise with respect to the cell current flowing in the selected memory cell. In general, due to a nonlinear resistance characteristic (also referred to as a low noise factor (LNF)) of the resistance-variable element, the cell current flowing in the semi-selected memory cells is smaller than the cell current flowing in the selected memory cells. However, in the case of a configuration where the memory cells are stacked three-dimensionally above the semiconductor substrate, the number of semi-selected memory cells sharply increases according to the increase of a memory size. For this reason, there is a possibility that the influence of noise caused by the cell current flowing in the semi-selected memory cells may become large so as not to be negligible. In addition, when plural bits of data are held in the memory cell, a difference in cell current between the levels of the resistance-variable element is relatively smaller than the difference in the case where 1 bit of data is held. For this reason, the influence of the noise caused by the cell current flowing in the semi-selected memory cells further increases, and data may not be normally read.

According to the first embodiment, the sense amplifier SA senses the cell current in two steps at the time of reading data. In a first step, the sense amplifier SA supplies the voltage Vread/2 to the selected global bit line GBL and the selected local bit line LBL and supplies the voltage VSS to the unselected global bit line GBL. The row decoder 12 supplies the voltage VSS to all the word lines WL. As a result, both the selected memory cell MC and the semi-selected memory cells MC go into the first semi-selected state. Further, the semi-selected memory cells MC go into the semi-selected state. Therefore, the sense amplifier SA may sense the sum of the cell currents supplied to the selected global bit line GBL when all the selected memory cell MC and the semi-selected memory cells MC go into the first semi-selected state.

In a second step, the sense amplifier SA supplies the voltage Vread to the selected global bit line GBL and the selected local bit line LBL, and supplies the voltage Vread/2 to the unselected global bit line GBL. The row decoder 12 supplies the voltage VSS to the selected word line WL and supplies the voltage Vread/2 to the unselected word line WL. As a result, the selected memory cell MC goes into the selected state, and the semi-selected memory cells MC go into the second semi-selected state. Further, the unselected memory cells MC go into the unselected state. Therefore, the sense amplifier SA may sense the sum of the cell currents supplied to the selected global bit line GBL when the selected memory cell MC is in the selected state and the semi-selected memory cells MC are in the second semi-selected state.

Then, the sense amplifier SA reads the data held in the selected memory cell MC based on the difference between the cell current sensed in the first step and the cell current sensed in the second step. The difference in cell current is acquired by subtracting the cell current (noise a) flowing in the memory cells MC in the first semi-selected state from the cell current (noise b) flowing in the memory cells MC in the second semi-selected state. Therefore, when the noise b and the noise a may be regarded as the same magnitude, noises a and b cancel each other, and as a result, the difference between the cell currents may be regarded as the cell current flowing in the memory cell MC in the selected state. Therefore, the cell current of the selected memory cell may be sensed while reducing the influence of the semi-selected memory cells.

The voltages supplied to the selected global bit line GBL and the selected local bit line LBL in the first step and the voltage supplied to the unselected word lines WL in the second step become an intermediate value between the voltages supplied to the selected global bit line GBL and the selected local bit line LBL and the voltage VSS in the second step. As a result, the magnitudes of the noise b and the noise a may be equalized.

The first end of the current mirror circuit CM1 is connected to the selected global bit line GBL. The second end of the current mirror circuit CM1 is connected to the first end of the capacitor C1 via the transistor Tr5, and is connected to the first end of the capacitor C2 via the transistor Tr7. As a result, the voltage Va corresponding to the cell current sensed in the first step and the voltage Vb corresponding to the cell current sensed in the second step may be charged in the capacitors C1 and C2, respectively.

The first end of the current mirror circuit CM2 is connected to the first end of the transistor Tr9 and the second end of the current mirror circuit CM2 is connected to the first end of the transistor Tr13 and the first end of the capacitor C3. The gate of the transistor Tr13 is connected to the first end of the first capacitor C1. The gate of the transistor Tr9 is connected to the first end of the second capacitor C2. As a result, the voltage Vc corresponding to a value obtained by subtracting the cell current sensed in the first step from the cell current sensed in the second step may be charged in the capacitor C3.

The comparators COMP1 to COMP3 compare the values of the voltages VREF1 to VREF3 and the voltage Vc so as to output the signals SAO1 to SAO3, respectively. As a result, even though the data held in the selected memory cell MC is multi-valued, the data may be read with high accuracy by the combination of the signals SAO1 to SAO3.

1.4 First Modification to First Embodiment

The semiconductor memory device according to the first embodiment has been described above in connection with a case of sensing, in the first step, a cell current when a selected memory cell MC and a semi-selected memory cell MC are in the first semi-selected state, and sensing, in the second step, a cell current when a selected memory cell is in the selected state and a semi-selected memory cell MC is in the second semi-selected state, but is not limited thereto. For example, the sense in the first step and the sense in the second step may be executed in a reverse order to the case of the first embodiment.

Figure 11:
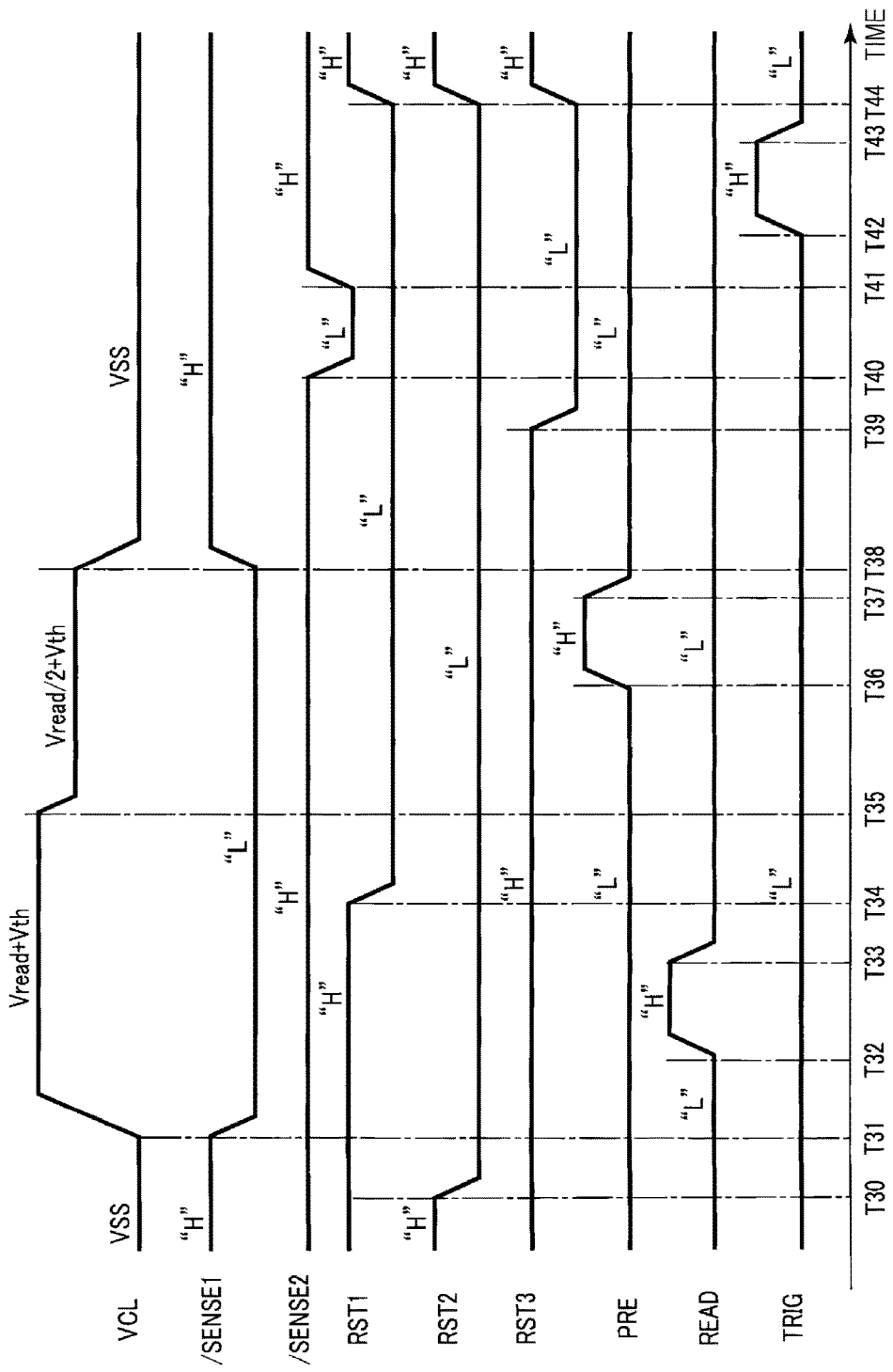
FIG. 11 is a timing chart for describing a reading operation of a semiconductor memory device according to a first modification to the first embodiment.
Figure 12:
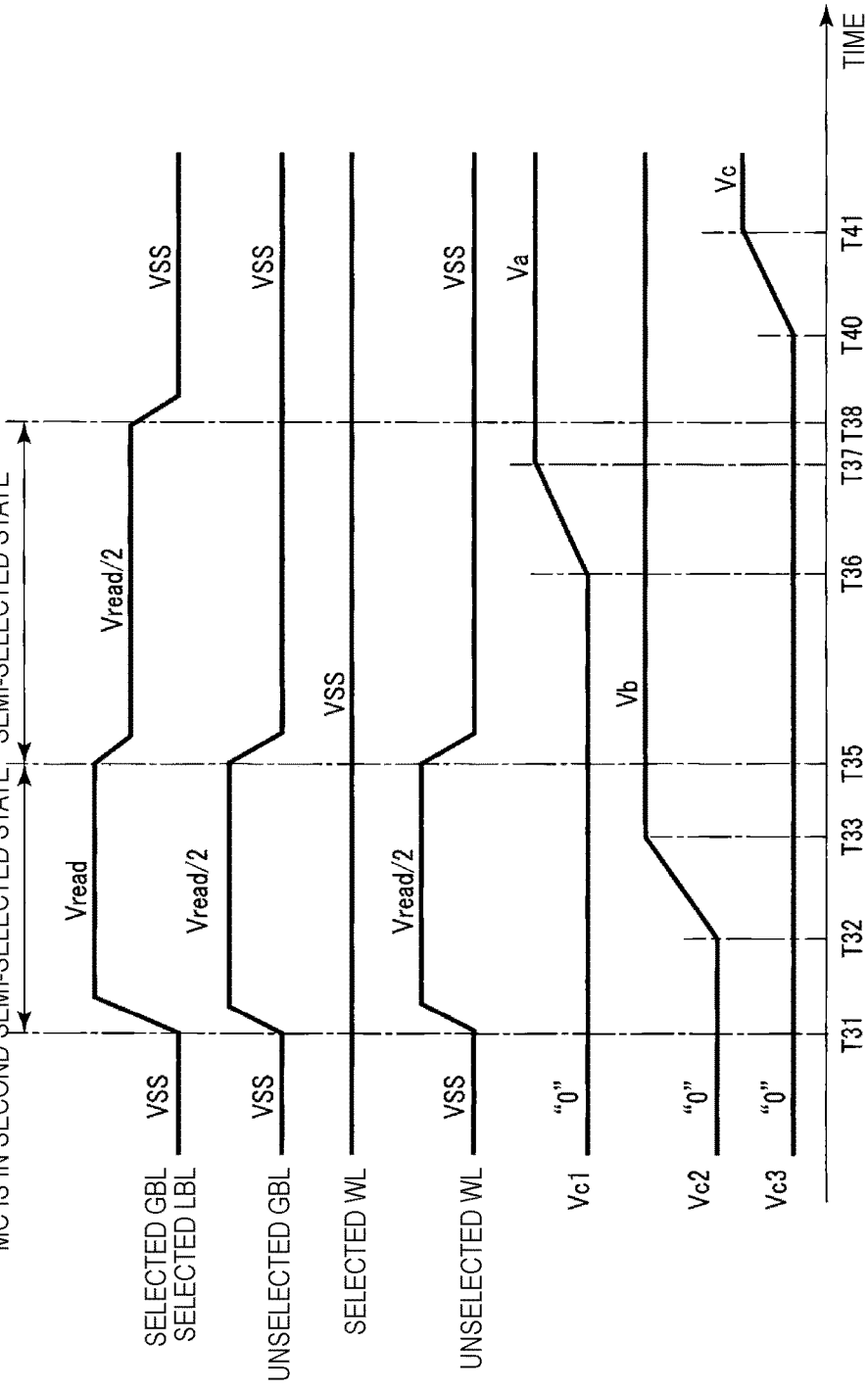
FIG. 12 is a timing chart for describing the reading operation of the semiconductor memory device according to the first modification to the first embodiment.

FIG. 11 is a timing chart for describing a state of a signal input to the sense amplifier in the reading operation of the semiconductor memory device according to a first modification to the first embodiment. FIG. 12 is a timing chart for describing states of a voltage supplied to various wirings and a voltage charged in a capacitor in the reading operation of the semiconductor memory device according to the first modification to the first embodiment. FIGS. 11 and 12 correspond to FIGS. 8 and 9 according to the first embodiment.

First, the details of the operation of the sense amplifier SA in the reading operation will be described with reference to FIG. 11.

As illustrated in FIG. 11, since the operation up to time T30 is the same as the operation up to time T10 in FIG. 8, the descriptions thereof will be omitted.

At time T30, the "L" level is supplied to the signal RST2. As a result, the transistor Tr8 goes into an off state, and the capacitor C2 goes into a chargeable state.

At time T31, the voltage (Vread+Vth) is supplied to the signal VCL and the "L" level is supplied to the signal /SENSE1. As a result, the current mirror circuit CM1 is electrically connected to the selected global bit line GBL and the power source VSA. In addition, the voltage Vread is supplied to the selected global bit line GBL and the sum of the cell currents flowing in the memory cell array 11 flows in the selected global bit line GBL according to the voltage Vread. The current mirror circuit CM1 supplies a mirror current of the current flowing in the selected global bit line GBL to the first end of the transistor Tr5 and the first end of the transistor Tr7.

At time T32, the "H" level is supplied to the signal READ and the transistor Tr7 goes into an on state. As a result, the capacitor C2 starts being charged by the mirror current from the current mirror circuit CM1.

At time T33, the "L" level is supplied to the signal READ and the transistor Tr7 goes into an off state. As a result, the capacitor C2 is electrically disconnected from the current mirror circuit CM1, and as a result the charging by the mirror current is terminated. As a result of charging the capacitor C2, the voltage depending on the charge amount Vc2 is transmitted to the gate of the transistor Tr9.

At time T34, the "L" level is supplied to the signal RST1. As a result, the transistor Tr6 goes into an off state, and the capacitor C1 goes into a chargeable state.

At time T35, the voltage Vread/2+Vth is supplied to the signal VCL. Then, the voltage Vread/2 is supplied to the selected global bit line GBL and the sum of the cell currents flowing in the memory cell array 11 flows according to the voltage Vread/2. The current mirror circuit CM1 supplies a mirror current of the current flowing in the selected global bit line GBL to the first end of the transistor Tr5 and the first end of the transistor Tr7.

At time T36, the "H" level is supplied to the signal PRE and the transistor Tr5 goes into an on state. As a result, the capacitor C1 starts being charged by the mirror current from the current mirror circuit CM1.

At time T37, the "L" level is supplied to the signal PRE and the transistor Tr5 goes into an off state. As a result, the capacitor C1 is electrically disconnected from the current mirror circuit CM1, and as a result, charging by the mirror current is terminated. As a result of charging the capacitor C1, the voltage depending on the charge amount Vc1 is transmitted to the gate of the transistor Tr13.

At time T38, the voltage VSS is supplied to the signal VCL and the "H" level is supplied to the signal /SENSE1. As a result, the current mirror circuit CM1 is electrically disconnected from the selected global bit line GBL and the power source VSA.

Since the operations from time T39 to time T44 are the same as the operations from time T19 to time T24 in FIG. 8, the descriptions thereof will be omitted.

The operations of the sense amplifier SA in the reading operation are now terminated.

Next, the details of the voltages supplied to the various wirings and the voltage of the capacitor in the reading operation will be described with reference to FIG. 12.

Herein, the time T31 to T41 illustrated in FIG. 12 corresponds to the time T31 to T41 illustrated in FIG. 11.

As illustrated in FIG. 12, since the operations up to time T31 is the same as the operations up to time T11 in FIG. 9, the descriptions thereof will be omitted.

At time T31, the sense amplifier SA supplies the voltage Vread to the selected global bit line GBL and the selected local bit line LBL and supplies the voltage Vread/2 to the unselected global bit line GBL. Further, the row decoder 12 supplies the voltage Vread/2 to the unselected word line WL. Therefore, the voltage Vread is supplied to the selected memory cell MC and the voltage Vread/2 is supplied to the semi-selected memory cells MC. No potential difference is generated across the unselected memory cells MC.

That is, at time T31, the cell current in the selected state flows in the selected memory cell MC. In the semi-selected memory cells MC, the cell current flows in the second semi-selected state. The unselected memory cells MC go into the unselected state and a current having a minute magnitude may flow therein, but a cell current having a significant magnitude compared with the selected state and the second semi-selected state does not flow. The cell currents flowing in all of the memory cells MC are distributed from the sense amplifier SA to each memory cell MC via the selected global bit line GBL.

The capacitor C2 is charged according to the magnitude of the total cell current flowing in the selected memory cell MC in the selected state and the semi-selected memory cell MC in the second semi-selected state from time T32 to time T33. As a result, the charge amount Vc2 of the capacitor C2 becomes the voltage Vb.

At time T35, the sense amplifier SA supplies the voltage Vread/2 to the selected global bit line GBL and the selected local bit line LBL, and supplies the voltage VSS to the unselected global bit line GBL. Further, the row decoder 12 supplies the voltage VSS to all word lines WL. Therefore, the voltage Vread/2 is supplied to the selected memory cell MC and the semi-selected memory cells MC. No potential difference is continuously generated across the unselected memory cells MC.

That is, at time T35, the cell current in a first semi-selected state flows in both the selected memory cell MC and the semi-selected memory cells MC. The unselected memory cells MC go into the unselected state and current having a minute magnitude may flow, but a cell current having a significant magnitude as compared with the selected state and the second semi-selected state does not flow. The cell currents flowing in all of the memory cells MC are distributed from the sense amplifier SA to each memory cell MC via the selected global bit line GBL.

The capacitor C1 is charged according to the magnitude of the total cell current flowing in the selected memory cell MC and the semi-selected memory cell MC in the first semi-selected state from time T36 to time T37. As a result, the charge amount Vc1 of the capacitor C1 becomes the voltage Va.

Since the operations from time T38 to time T41 are the same as the operations from time T18 to time T21 in FIG. 9, the descriptions thereof will be omitted.

With the above operation, the capacitor C2 may be charged with the voltage Vb before the capacitor C1 is charged with the voltage Va. As a result, even in the case where the selected memory cell MC is brought into the semi-selected state after being brought into the selected state, the same effect as in the first embodiment may be obtained.

1.5 Second Modification to First Embodiment

The semiconductor memory device according to the first embodiment has been described above in connection with the case where the voltage Vread/2 is supplied to the unselected global bit line GBL in the sense in the second step, but is not limited thereto.

Figure 13:
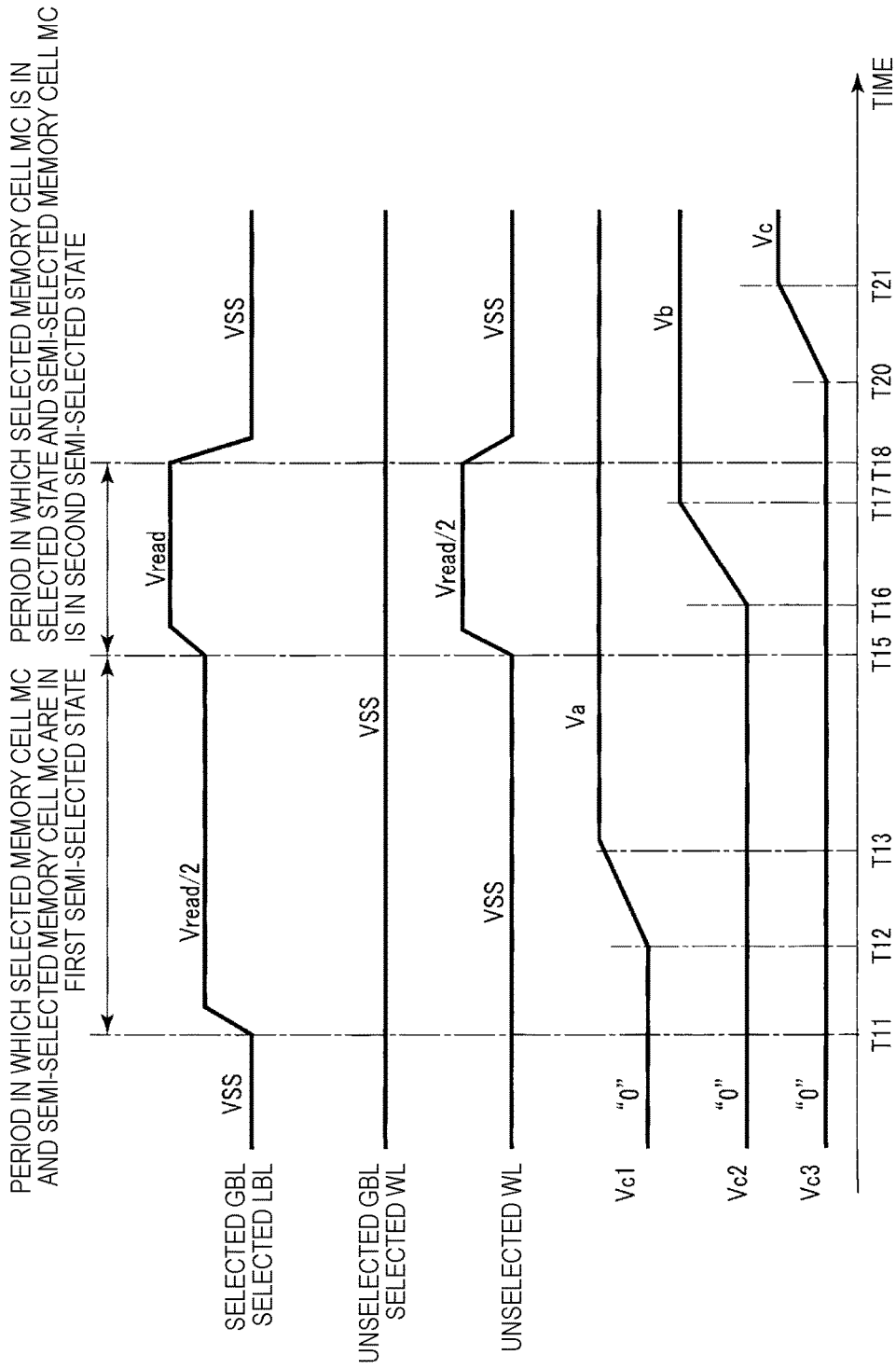
FIG. 13 is a timing chart for describing a reading operation of a semiconductor memory device according to a second modification to the first embodiment.

FIG. 13 is a timing chart for describing states of a voltage supplied to various wirings and a voltage charged in a capacitor in the reading operation of the semiconductor memory device according to a second modification to the first embodiment. FIG. 13 corresponds to FIG. 9 in the first embodiment. As illustrated in FIG. 13, the sense amplifier SA may supply the voltage VSS to the unselected global bit line GBL from time T15 to time T18.

In this case, the voltage VSS is supplied to the unselected local bit line LBL provided on the unselected global bit line GBL. Therefore, no potential difference is generated across the unselected memory cell MC connected to the unselected local bit line LBL provided on the unselected global bit line GBL and the selected word line WL. As a result, the unselected memory cell MC provided on the unselected global bit line GBL is maintained in the unselected state. Therefore, the influence of the cell current flowing in the unselected memory cell MC on the unselected global bit line GBL and flowing into the selected global bit line GBL may be reduced.

The second modification to the first embodiment may be similarly applied to the first modification to the first embodiment. That is, the sense amplifier SA may supply the voltage VSS to the unselected global bit line GBL from time T31 to time T35 of FIG. 12 according to the first modification to the first embodiment. Accordingly, the first modification to the first embodiment may also achieve the same effects as those of the second modification to the first embodiment.

2. Second Embodiment

Next, a semiconductor memory device according to a second embodiment will be described. In the first embodiment, a voltage corresponding to the sense result of the first step is charged in the capacitor C1, a voltage corresponding to the sense result of the second step is charged in the capacitor C2, and a voltage corresponding to the difference between the sense result of the first step and sense result of the second step is charged in the capacitor C3. In this regard, the second embodiment is different from the first embodiment in that the voltage corresponding to the difference between the sense result of the first step and the sense result of the second step is directly charged in the capacitor C2 without using the capacitor C3. Hereinafter, features different from those of the first embodiment will be described.

2.1 Configuration of Sense Amplifier

Figure 14:
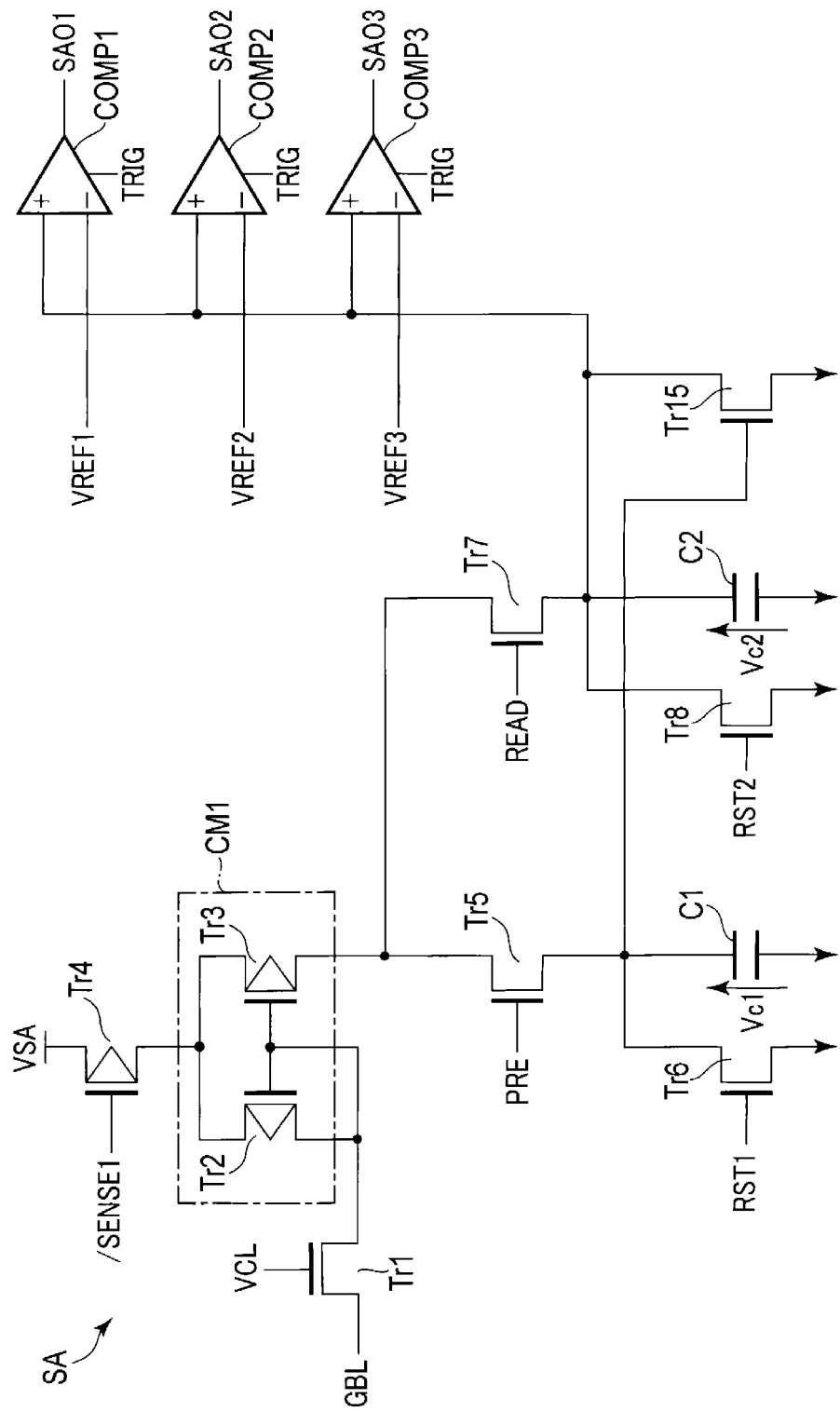
FIG. 14 is a circuit diagram of a sense amplifier of a semiconductor memory device according to a second embodiment.

First, the configuration of a sense amplifier of the semiconductor memory device according to the second embodiment will be described. FIG. 14 is a circuit diagram for describing the configuration of a sense amplifier of the semiconductor memory device according to the second embodiment. FIG. 14 corresponds to FIG. 6 according to the first embodiment.

As illustrated in FIG. 14, a sense amplifier SA includes transistors Tr1, Tr2, Tr3, Tr4, Tr5, Tr6, Tr7, Tr8, and Tr15, capacitors C1 and C2, and comparators COMP1, COMP2, and COMP3. Since configurations of the transistors Tr1 to Tr4 are the same as those of the transistors Tr1 to Tr4 illustrated in FIG. 6, the descriptions thereof will be omitted.

The transistor Tr15 includes a first end that is commonly connected to a second end of the transistor Tr7, a first end of the transistor Tr8, a first end of the capacitor C2, and a first input end of each of the comparators COMP1 to COMP3, a grounded second end, and a gate that is commonly connected to a second end of the transistor Tr5, a first end of the transistor Tr6, and a first end of the capacitor C1.

2.2 Reading Operation

Figure 15:
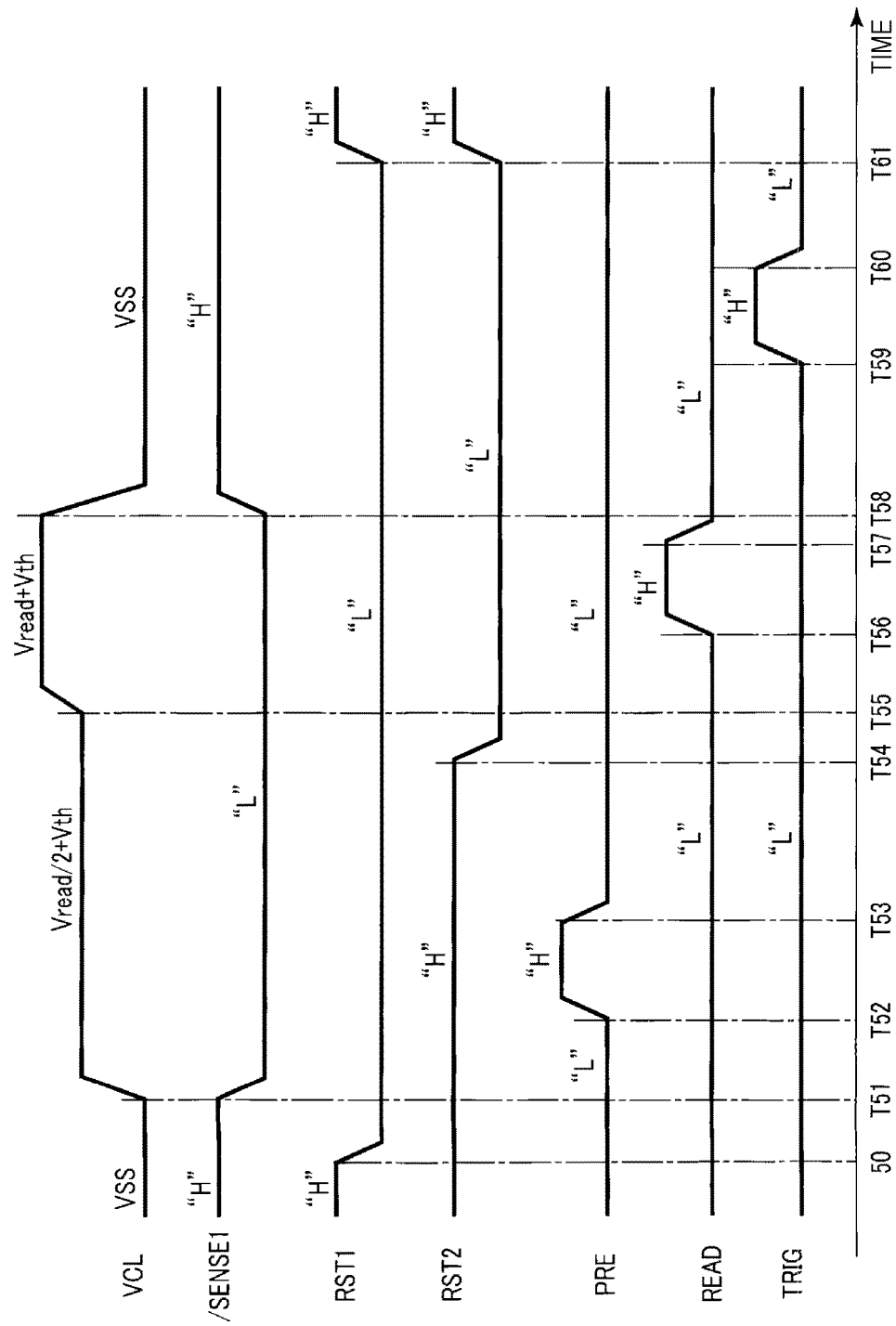
FIG. 15 is a timing chart for describing a reading operation of the semiconductor memory device according to the second embodiment.
Figure 16:
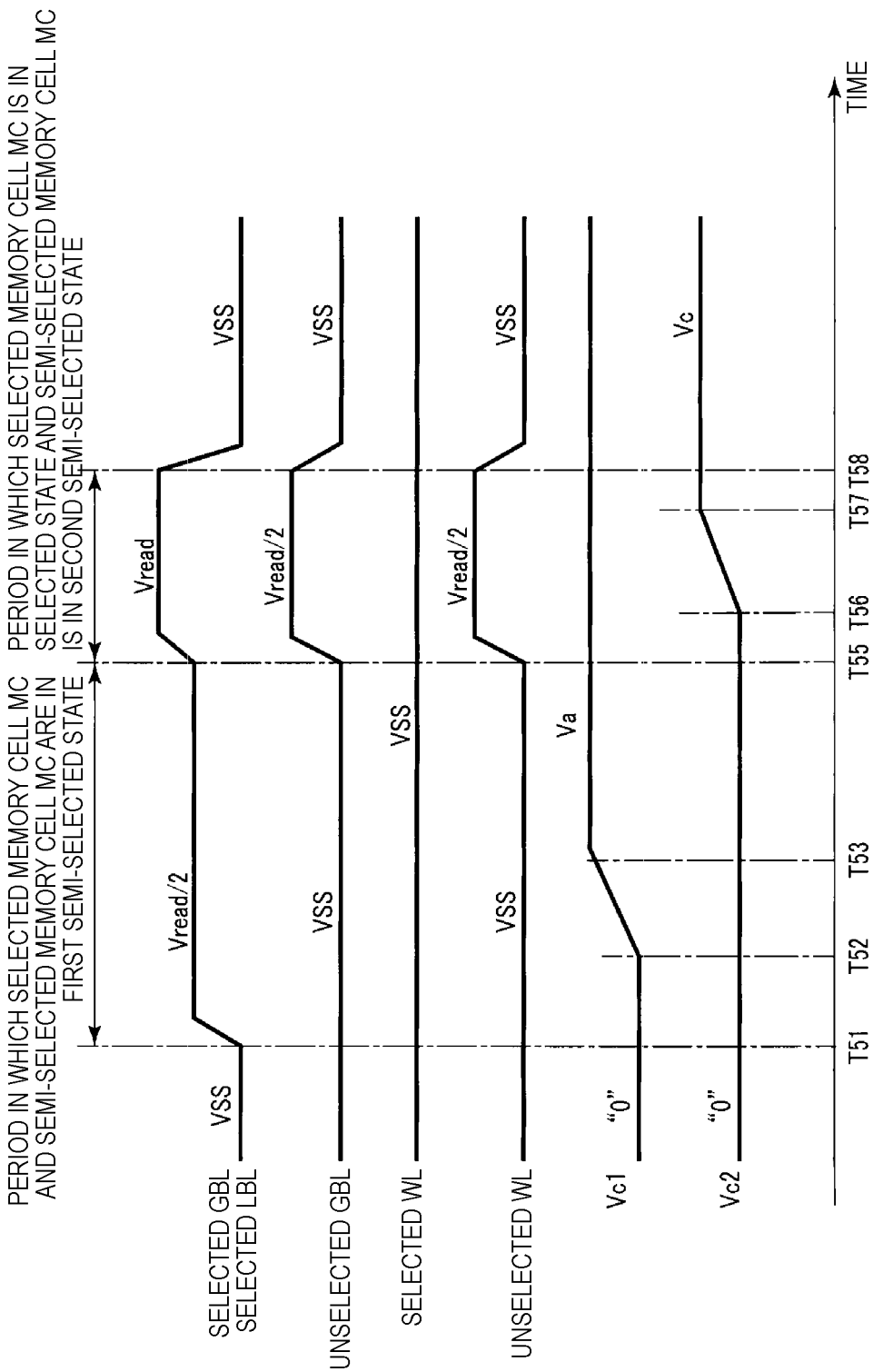
FIG. 16 is a timing chart for describing the reading operation of the semiconductor memory device according to the second embodiment.

Next, the reading operation of the semiconductor memory device according to the second embodiment will be described with reference to FIGS. 15 and 16. FIG. 15 is a timing chart for describing a state of a signal input to the sense amplifier during a reading operation of the semiconductor memory device according to the second embodiment. FIG. 16 is a timing chart for describing states of a voltage supplied to various wirings and a voltage charged in the capacitor during the reading operation of the semiconductor memory device according to the first embodiment. FIGS. 15 and 16 correspond to FIGS. 8 and 9 according to the first embodiment.

First, details of the operation of the sense amplifier SA during the reading operation will be described with reference to FIG. 15.

As illustrated in FIG. 15, up to time T50, voltage VSS is supplied to a signal VCL. As a result, a current mirror circuit CM1 is electrically disconnected from a selected global bit line GBL. In addition, an "H" level is supplied to a signal /SENSE1. As a result, the transistor Tr4 goes into an off state, and the current mirror circuit CM1 is electrically disconnected from a power source VSA. Further, an "L" level is supplied to signals PRE and READ, and the "H" level is supplied to signals RST1 and RST2. As a result, the charging of the capacitors C1 and C2 is reset. In addition, the "L" level is supplied to a signal TRIG. Thus, the comparators COMP1 to COMP3 are not driven.

Since the operations from time T50 to time T52 are the same as the operations from time T10 to time T12 in FIG. 8, the descriptions thereof will be omitted.

At time T53, the "L" level is supplied to the signal PRE, and the transistor Tr5 goes into an off state. Accordingly, the capacitor C1 is electrically disconnected from the current mirror circuit CM1, and the charging by the mirror current is terminated. As a result of charging the capacitor C1, a voltage depending on a charge amount Vc1 is transmitted to the gate of the transistor Tr15.

Since the operations at time T54 and time T55 are the same as the operations at time T14 and time T15 in FIG. 8, the descriptions thereof will be omitted.

At time T56, the "H" level is supplied to the signal READ, and the transistor Tr7 goes into an on state. Accordingly, the mirror current from the current mirror circuit CM1 is distributed to the capacitor C2 and the transistor Tr15. Specifically, in the capacitor C2, a differential current having a magnitude obtained by subtracting the current flowing in the transistor Tr15 from the mirror current flowing from the current mirror circuit CM1 flows. The capacitor C2 starts being charged by the differential current.

Further, the current flowing in the transistor Tr15 is controlled by a relationship between the magnitude of the charge amount Vc1 supplied to the gate of the transistor Tr15 and the characteristic of the transistor Tr15. The characteristic of the transistor Tr15 is adjusted, for example, by a threshold voltage, a gate width, and a gate length of the transistor Tr15. In addition, as a result of the adjustment, the current flowing in the transistor Tr15 may be set to have, for example, a magnitude equal to that of the current flowing into the first end of the capacitor C1.

At time T57, the "L" level is supplied to the signal READ, and the transistor Tr7 goes into an off state. Accordingly, the capacitor C2 is electrically disconnected from the current mirror circuit CM1, and the charging by the mirror current is terminated. As a result of the charging of the capacitor C2, a voltage according to a charge amount Vc2 is input to the first input end of each of the comparators COMP1 to COMP3.

At time T58, the voltage VSS is supplied to the signal VCL and the "H" level is supplied to the signal /SENSE1. As a result, the current mirror circuit CM1 is electrically disconnected from the selected global bit line GBL and the power source VSA.

At time T59, the "H" level is supplied to a signal TRIG. Thus, the driving of the comparators COMP1 to COMP3 is started. The voltages VREF1 to VREF3 are input to the second input ends of the comparators COMP1 to COMP3, respectively, and signals SAO1 to SAO3 are output from the output ends of the comparators COMP1 to COMP3, respectively. In addition, based on the signals SAO1 to SAO3, data held in a selected memory cell MC is determined.

At time T60, the "L" level is supplied to the signal TRIG. Thus, the driving of the comparators COMP1 to COMP3 is stopped.

At time T61, the "H" level is supplied to signals RST1 and RST2. As a result, the voltage charged in the capacitors C1 and C2 is reset.

The operations of the sense amplifier SA in the read operation are now completed.

Next, the details of the voltage supplied to the various wirings and the voltage of the capacitor during the reading operation will be described with reference to FIG. 16. Alternatively, the time T51 to T61 illustrated in FIG. 16 corresponds to the time T51 to T61 illustrated in FIG. 15.

As illustrated in FIG. 16, up to time T51, the sense amplifier SA supplies the voltage VSS to the global bit line GBL and the local bit line LBL. Further, the row decoder 12 supplies the voltage VSS to the word line WL. For this reason, no current flows in all of the memory cells MC in the memory cell array 11. Further, since the capacitors C1 and C2 are not charged, the charge amounts Vc1 and Vc2 are "0".

At time T51, the sense amplifier SA supplies a voltage Vread/2 to the selected global bit line GBL and the selected local bit line LBL. For this reason, the voltage Vread/2 is supplied to the selected memory cell MC and the semi-selected memory cells MC. On the other hand, a potential difference is not continuously generated across the unselected memory cells MC. That is, the selected memory cell MC and the semi-selected memory cells MC go into a first semi-selected state, and the unselected memory cells MC go into an unselected state.

From time T52 to time T53, the capacitor C1 is charged according to the magnitude of the total cell current flowing in the selected memory cell MC and the semi-selected memory cell MC in the first semi-selected state. As a result, the charge amount Vc1 of the capacitor C1 becomes a voltage Va.

At time T55, the sense amplifier SA supplies a voltage Vread to the selected global bit line GBL and the selected local bit line LBL and supplies the voltage Vread/2 to the unselected global bit line GBL. Further, the row decoder 12 supplies the voltage Vread/2 to the unselected word line WL. For this reason, the voltage Vread is supplied to the selected memory cell MC and the voltage Vread/2 is supplied to the semi-selected memory cells MC. On the other hand, a potential difference is not continuously generated across the unselected memory cells MC. That is, the selected memory cell MC go into a selected state, the semi-selected memory cells MC go into a second semi-selected state, and the unselected memory cells MC go into an unselected state.

From time T56 to time T57, the capacitor C2 is charged according to the magnitude of a differential current obtained by subtracting the current flowing in the transistor Tr15 from the mirror current flowing from the current mirror circuit CM1. The mirror current flowing from the current mirror circuit CM1 corresponds to the total cell current flowing in the selected memory cell MC in the selected state and the semi-selected memory cell MC in the second semi-selected state. The current flowing in the transistor Tr15 corresponds to the total cell current flowing in the selected memory cell MC in the first semi-selected state and the semi-selected memory cell MC. That is, the differential current corresponds to the cell current flowing in the selected memory cell MC in the selected state. As a result, the charge amount Vc2 of the capacitor C2 becomes a voltage Vc.

At time T58, the sense amplifier SA supplies a voltage VSS to both the global bit lines GBL and the local bit line LBL. Further, the row decoder 12 supplies the voltage VSS to all of the word lines WL. Accordingly, the voltage supply to all the memory cells MC is stopped.

The voltage Vc obtained as described above is compared with the voltages VREF1 to VREF3 by the comparators COMP1 to COMP3, respectively. The comparators COMP1 to COMP3 output the signals SAO1 to SAO3, respectively, so as to determine the level of data written in the selected memory cell MC.

2.3 Effects According to Second Embodiment

According to the second embodiment, the first end of the current mirror circuit CM1 is connected to the selected global bit line GBL. The second end of the current mirror circuit CM1 is connected to the first end of the capacitor C1 through the transistor Tr5 and connected to the first end of the capacitor C2 and the first end of the transistor Tr15 through the transistor Tr7. Accordingly, the capacitor C1 may be charged with the voltage Va corresponding to the cell current sensed in the first step. Further, the capacitor C2 may be charged with the voltage Vc corresponding to the differential current between the cell current sensed in the second step and the cell current sensed in the first step. Therefore, the influence of the cell current flowing in the semi-selected memory cell may be considered while reducing the circuit scale compared to the first embodiment.

2.4 First Modification to Second Embodiment

The semiconductor memory device according to the second embodiment has been described above in connection with the case of sensing, in the first step, the cell current when the selected memory cell MC and the semi-selected memory cell MC are in the first semi-selected state, and sensing, in the second step, the cell current when the selected memory cell MC is in the selected state and the semi-selected memory cell MC is in the second semi-selected state, but is not limited thereto. For example, the sense of the first step and the sense of the second step may be performed in the reverse order to those of the second embodiment.

Figure 17:
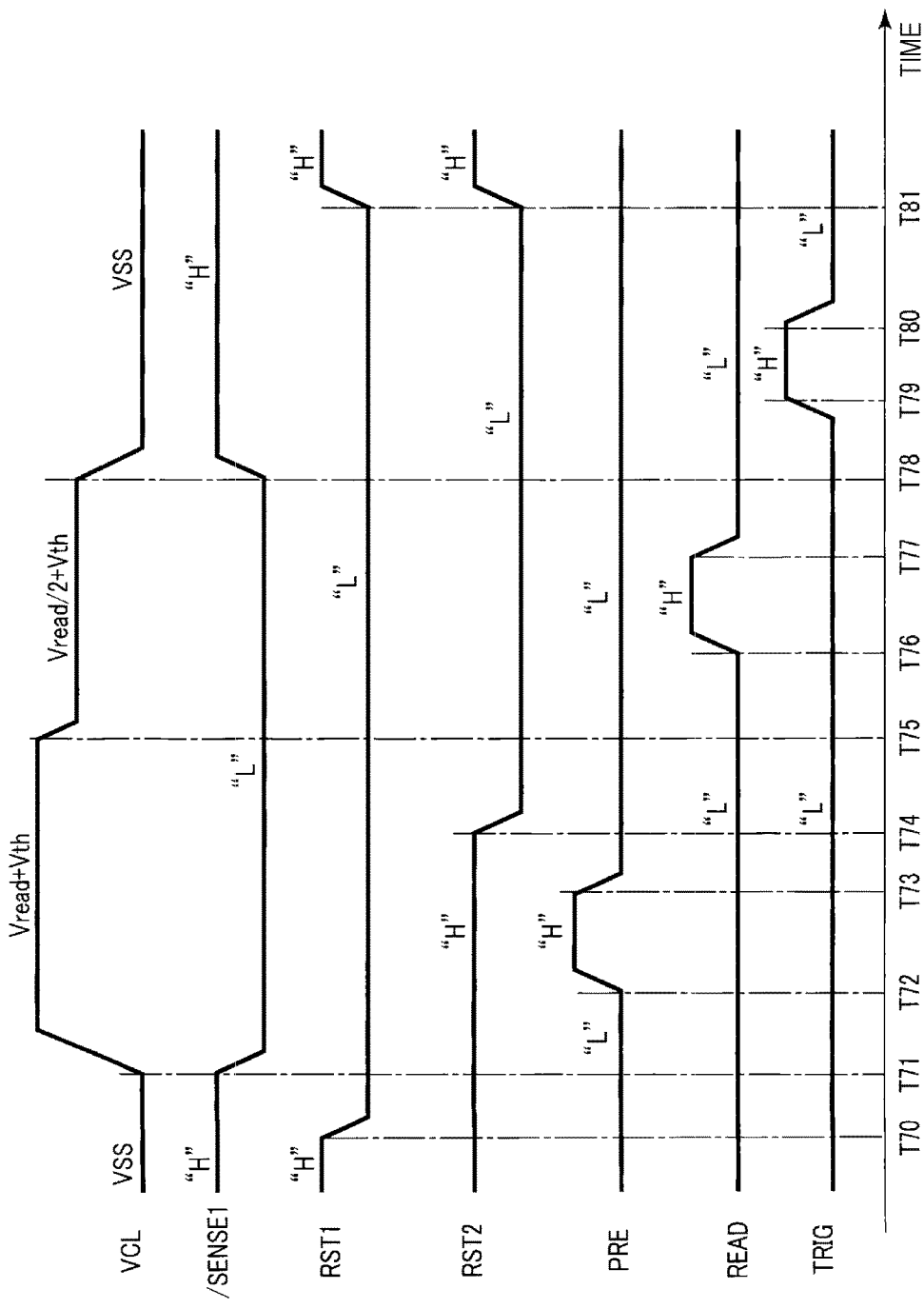
FIG. 17 is a timing chart for describing a reading operation of a semiconductor memory device according to a first modification to the second embodiment.
Figure 18:
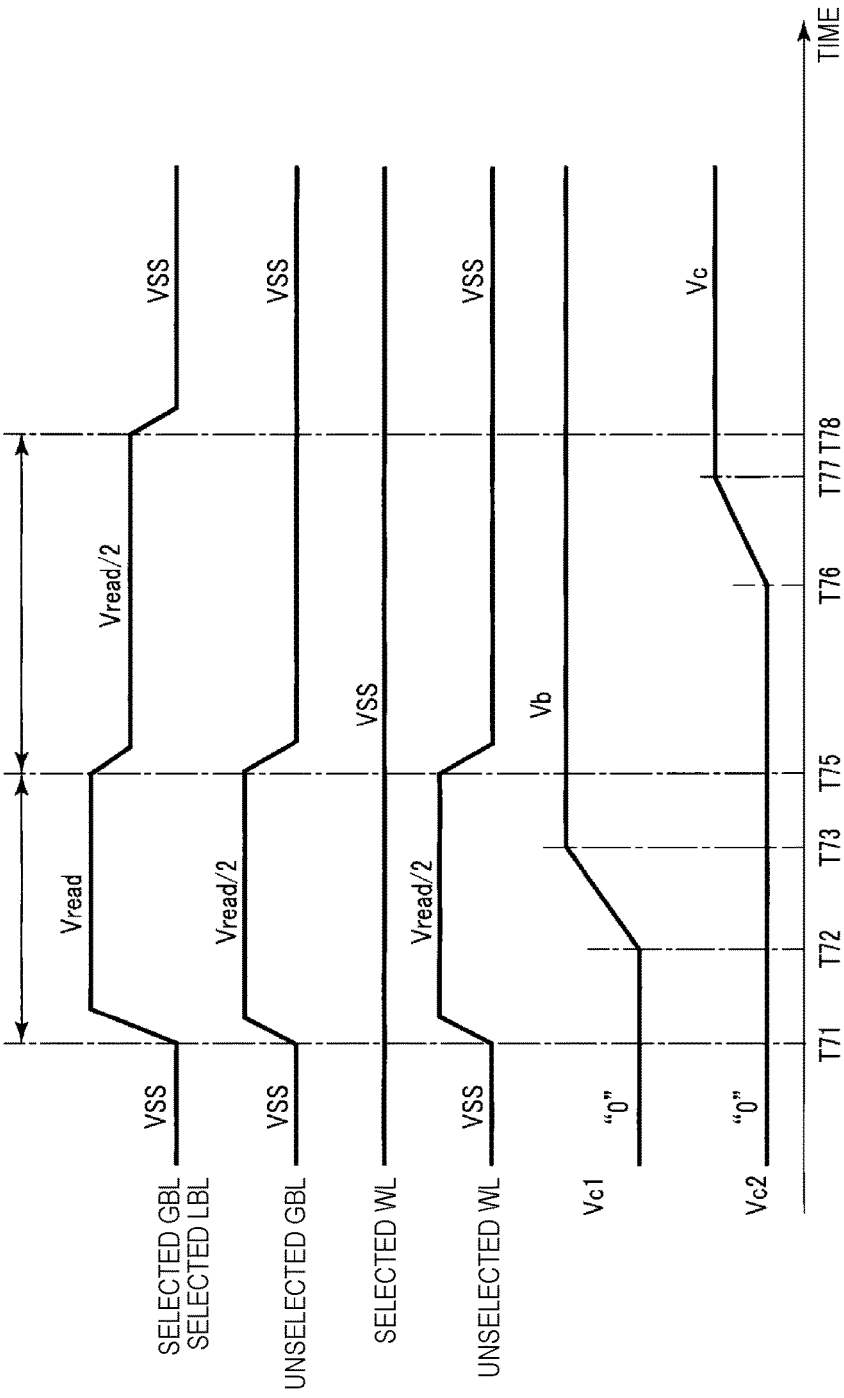
FIG. 18 is a timing chart for describing the reading operation of the semiconductor memory device according to the first modification to the second embodiment.

FIG. 17 is a timing chart for describing a state of a signal input to the sense amplifier during a reading operation of the semiconductor memory device according to the first modification to the second embodiment. FIG. 18 is a timing chart for describing states of a voltage supplied to various wirings and a voltage charged in the capacitor during the reading operation of the semiconductor memory device according to the first modification to the second embodiment. FIGS. 17 and 18 correspond to FIGS. 15 and 16 according to the second embodiment.

First, the details of the operations of the sense amplifier SA during the reading operation will be described with reference to FIG. 17.

As illustrated in FIG. 17, since the operations up to time T70 and the operation at time T70 are the same as the operations up to time T50 and the operation at time T50 in FIG. 15, the descriptions thereof will be omitted.

At time T71, a voltage Vread+Vth is supplied to the signal VCL and the "L" level is supplied to the signal /SENSE1. As a result, the current mirror circuit CM1 is electrically connected with the selected global bit line GBL and the power source VSA. In addition, the voltage Vread is supplied to the selected global bit line GBL, and the sum of the cell currents flowing in the memory cell array 11 flows according to the voltage Vread. The current mirror circuit CM1 supplies the mirror current of the current flowing in the selected global bit line GBL to the first end of the transistor Tr5 and the first end of the transistor Tr7.

Since the operations from time T72 to time T74 are the same as the operations from time T52 to time T54 in FIG. 15, the descriptions thereof will be omitted.

At time T75, a voltage Vread/2+Vth is supplied to the signal VCL. Accordingly, the voltage Vread/2 is supplied to the selected global bit line GBL, and the sum of the cell currents flowing in the memory cell array 11 flows according to the voltage Vread/2. The current mirror circuit CM1 supplies the mirror current of the current flowing in the selected global bit line GBL to the first end of the transistor Tr5 and the first end of the transistor Tr7.

At time T76, the "H" level is supplied to the signal READ, and the transistor Tr7 goes into an on state. Accordingly, the mirror current flowing from the current mirror circuit CM1 is distributed to the capacitor C2 and the transistor Tr15. Specifically, in the capacitor C2, a differential current having a magnitude obtained by subtracting the current flowing in the transistor Tr15 from the mirror current flowing from the current mirror circuit CM1 flows. The capacitor C2 starts being charged by the differential current.

Alternatively, the current flowing in the capacitor C2 may beset to have, for example, a magnitude equal to that of the mirror current corresponding to the cell current flowing in the selected memory cell MC in the selected state. That is, the current flowing in the transistor Tr15 may have a magnitude obtained by subtracting the mirror current corresponding to the cell current flowing in the selected memory cell MC in the selected state from the mirror current supplied from the current mirror circuit CM1 to the capacitor C2 and the transistor Tr15. As described above, the current flowing in the transistor Tr15 is controlled by a relationship between the magnitude of the charge amount Vc1 supplied to the gate (gate node) of the transistor Tr15 and the characteristic of the transistor Tr15. Further, as described above, the characteristic of the transistor Tr15 is adjusted, for example, by a threshold voltage, a gate width, and a gate length of the transistor Tr15. That is, the characteristic of the transistor Tr15 set as a result of the adjustment maybe different from, for example, the characteristic of the transistor Tr15 set in the second embodiment.

Since the operations from time T77 to time T81 are the same as the operations from time T57 to time T61 in FIG. 15, the descriptions thereof will be omitted.

The operations of the sense amplifier SA in the read operation are now completed.

Next, the details of the voltages supplied to the various wirings and the voltages of the capacitors during the reading operation will be described with reference to FIG. 18. At this time, the time T71 to T78 illustrated in FIG. 18 corresponds to the time T51 to T58 illustrated in FIG. 16.

As illustrated in FIG. 18, since the operations up to time T71 are the same as the operations up to time T51 in FIG. 16, the descriptions thereof will be omitted.

At time T71, the sense amplifier SA supplies the voltage Vread to the selected global bit line GBL and the selected local bit line LBL and supplies the voltage Vread/2 to the unselected global bit line GBL. Further, the row decoder 12 supplies the voltage Vread/2 to the unselected word line WL. For this reason, the voltage Vread is supplied to the selected memory cell MC and the voltage Vread/2 is supplied to the semi-selected memory cells MC. A potential difference is not generated across the unselected memory cells MC.

That is, at time T71, the cell current in the selected state flows in the selected memory cell MC. The cell current in the second semi-selected state flows in the semi-selected memory cells MC. The unselected memory cells MC go into an unselected state, and current having a minute magnitude may flow, but a cell current having a significant magnitude compared with the selected state and the second semi-selected state does not flow. The cell current flowing in all of the memory cells MC is supplied from the sense amplifier SA to the selected global bit line GBL and distributed to each memory cell MC.

From time T72 to time T73, the capacitor C1 is charged according to the magnitude of the total cell current flowing in the selected memory cell MC in the selected state and the semi-selected memory cell MC in the second semi-selected state. As a result, the charge amount Vc1 of the capacitor C1 becomes a voltage Vb.

At time T75, the sense amplifier SA supplies a voltage Vread/2 to the selected global bit line GBL and the selected local bit line LBL, and supplies the voltage VSS to the unselected global bit line GBL. Further, the row decoder 12 supplies the voltage VSS to all of the word lines WL. For this reason, the voltage Vread/2 is supplied to the selected memory cell MC and the semi-selected memory cells MC. On the other hand, a potential difference is not continuously generated across the unselected memory cells MC.

That is, at time T75, the cell current in the first semi-selected state flows in all of the selected memory cells MC and the semi-selected memory cells MC. The unselected memory cells MC are in an unselected state, and a minute magnitude of current may flow, but a cell current having a significant magnitude as compared with the selected state and the second semi-selected state does not flow. The cell current flowing in all of the memory cells MC is supplied from the sense amplifier SA to the selected global bit line GBL, and distributed to each memory cell MC.

From time T76 to time T77, the capacitor C2 is charged according to the magnitude of a differential current obtained by subtracting the current flowing in the transistor Tr15 from the mirror current from the current mirror circuit CM1. The current flowing in the capacitor C2 corresponds to, for example, the cell current flowing in the selected memory cell MC in the selected state. As a result, the charge amount Vc2 of the capacitor C2 becomes a voltage Vc.

Since the operations after time T78 is the same as the operation after time T58 in FIG. 16, the descriptions thereof will be omitted.

With the above operations, after the voltage Vb is charged in the capacitor C1, the voltage Vc may be charged in the capacitor C2. Accordingly, even when the selected memory cell MC is in the selected state and then in the semi-selected state, the same effect as the second embodiment may be achieved.

2.5 Second Modification to Second Embodiment

The semiconductor memory device according to the second embodiment has been described above in connection with the case where the voltage Vread/2 is supplied to an unselected global bit line GBL in the sense of the second step is described, but is not limited thereto.

Figure 19:
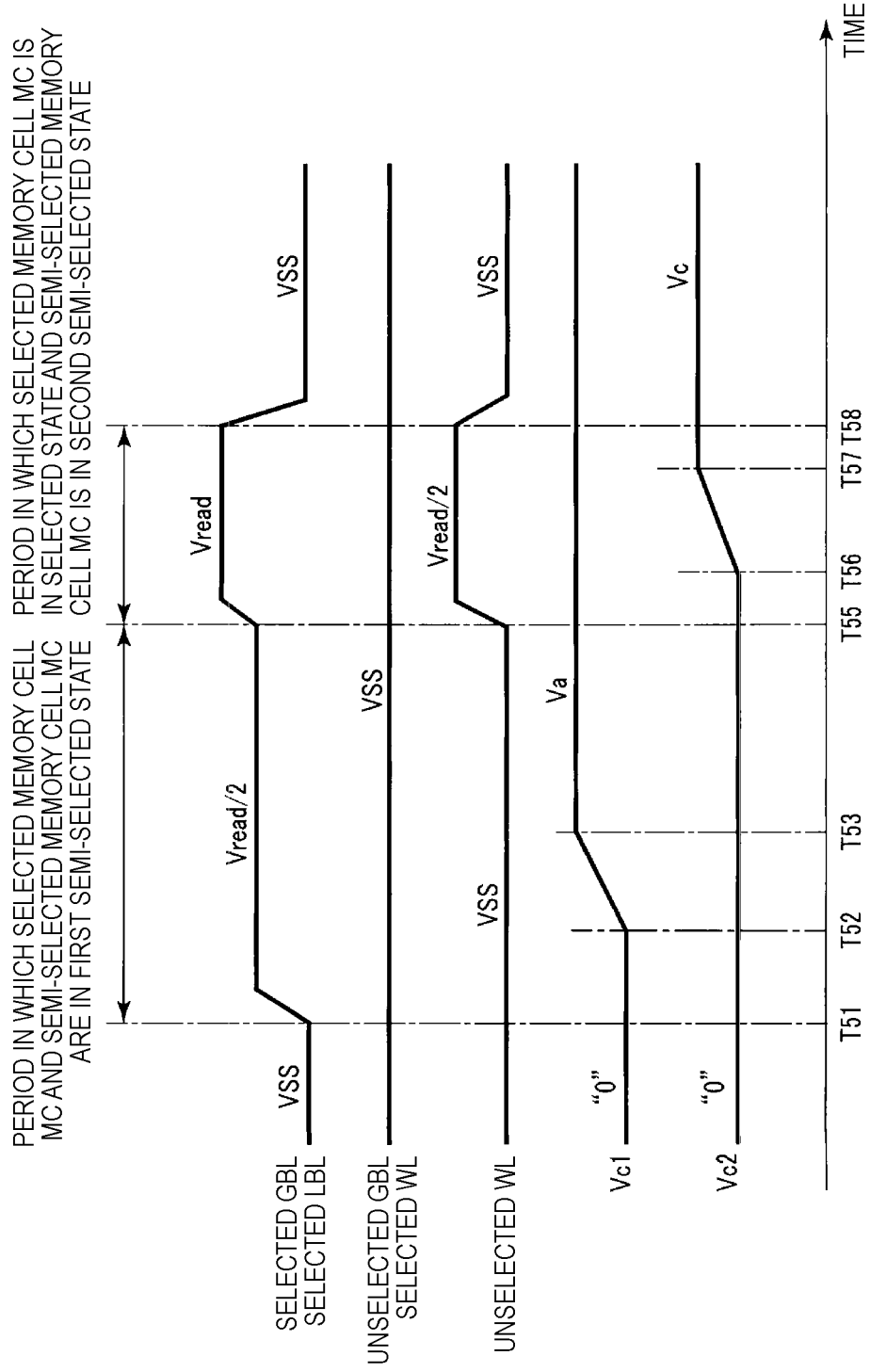
FIG. 19 is a timing chart for describing a reading operation of a semiconductor memory device according to a second modification to the second embodiment.

FIG. 19 is a timing chart for describing states of voltages supplied to various wirings and voltages charged in capacitors during the reading operation of the semiconductor memory device according to the second modification to the second embodiment. FIG. 19 corresponds to FIG. 16 according to the second embodiment. As illustrated in FIG. 19, from time T55 to time T58, the sense amplifier SA may supply the voltage VSS to the unselected global bit line GBL.

In this case, the voltage VSS is supplied to the unselected local bit line LBL provided on the unselected global bit line GBL. For this reason, no potential difference is generated across the unselected memory cell MC connected to the unselected local bit line LBL provided on the unselected global bit line GBL and a selected word line WL. As a result, the unselected memory cell MC provided on the unselected global bit lines GBL is maintained in the unselected state. Therefore, the influence of the cell current flowing in the unselected memory cell MC on the unselected global bit line GBL and flowing into the selected global bit line GBL may be reduced.

Alternatively, the second modification to the second embodiment is also applicable to the first modification to the second embodiment. That is, from time T71 to time T75 in FIG. 18 according to the first modification to the second embodiment, the sense amplifier SA may supply the voltage VSS to the unselected global bit line GBL. Accordingly, the second modification to the second embodiment may also achieve the same effect as the first modification to the second embodiment.

2.6 Third Modification to Second Embodiment

In the second embodiment and the first modification to the second embodiment, it has been described that the characteristics of the transistor Tr15 may be changed. As such, the characteristics of the transistor Tr15 may be randomly changed in any range. For example, the characteristics of the transistor Tr15 may be changed for each reading method or for each memory cell MC.

Figure 20:
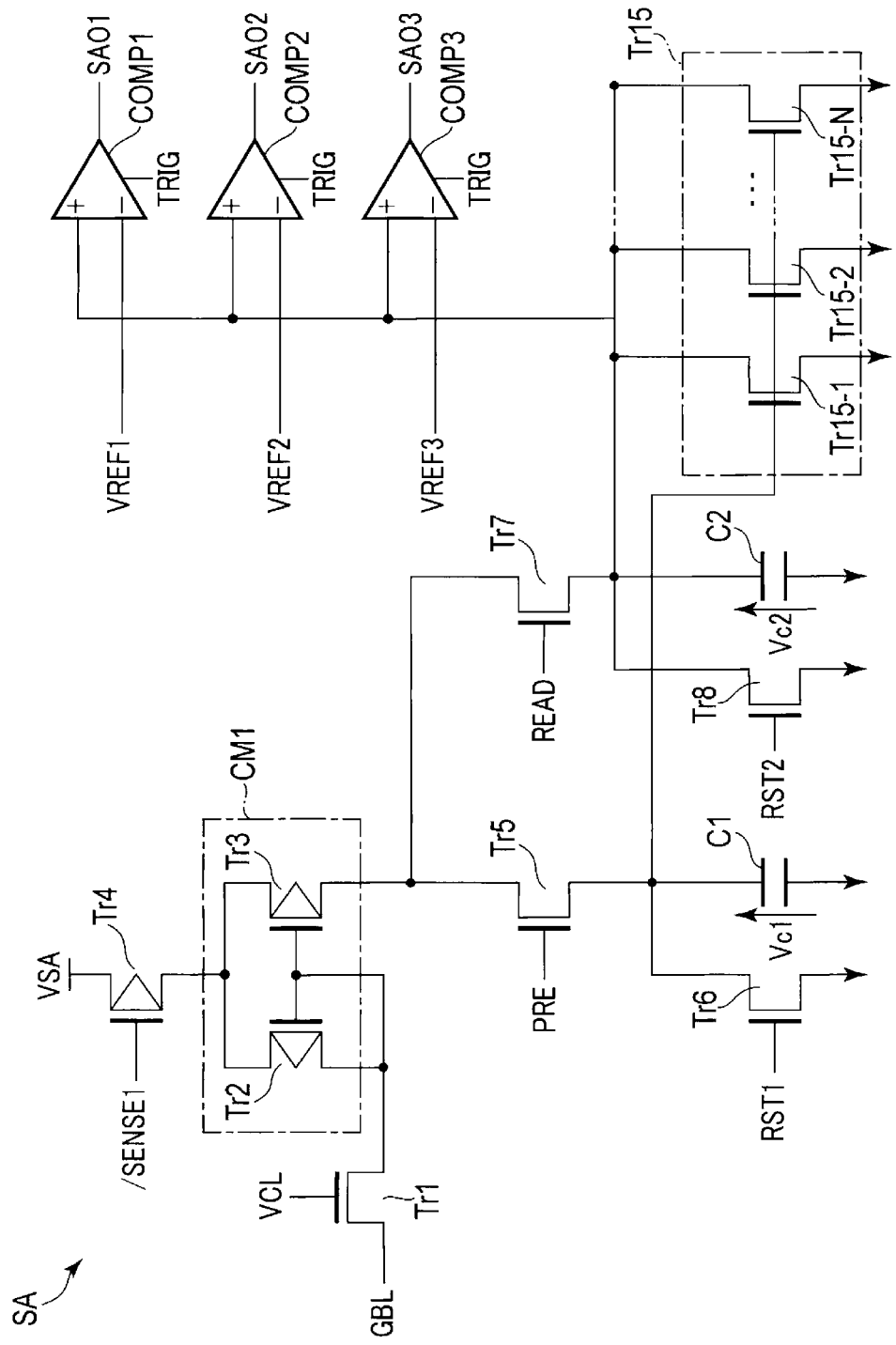
FIG. 20 is a circuit diagram of a sense amplifier of a semiconductor memory device according to a third modification to the second embodiment.

FIG. 20 is a circuit diagram for describing a configuration of a sense amplifier of the semiconductor memory device according to a third modification to the second embodiment. As illustrated in FIG. 20, the transistor Tr15 includes N transistors Tr15-1, Tr15-2 . . . and Tr15-N (N is an integer of 3 or more).

The transistors Tr15-1, Tr15-2 . . . Tr15-N are provided in parallel with each other. More specifically, the first end of each of the transistors Tr15-1, Tr15-2 . . . Tr15-N is commonly connected to the second end of the transistor Tr7, the first end of the transistor Tr8, the first end of the capacitor C2, and the first input end of each of the comparators COMP1 to COMP3. The second end of each of the transistors Tr15-1, Tr15-2 . . . Tr15-N is grounded. The gate node of each of the transistors Tr15-1, Tr15-2 . . . and Tr15-N is commonly connected to the second end of the transistor Tr5, the first end of the transistor Tr6, and the first end of the capacitor C1.

The sense amplifier SA includes a switch group (not specifically illustrated) that switches whether to operate each of the transistors Tr15-1, Tr15-2 . . . Tr15-N. Accordingly, the sense amplifier SA may arbitrarily change the number of transistors to be operated, among the N transistors in the transistor Tr15. In addition, the number of transistors to be operated may be changed depending on the reading operation (for example, any of the reading operation according to the second embodiment and the reading operation according to the first modification to the second embodiment) or the memory cell MC from which the data is read.

In addition, the sense amplifier SA may receive the number of transistors to be operated from the control unit 16. The control unit 16 may determine the number of transistors to be operated by reading a value stored, for example, in a fuse or a mode register (not specifically illustrated).

According to the third modification to the second embodiment, the transistor Tr15 includes transistors Tr15-1, Tr15-2 . . . Tr15-N, which are connected to each other in parallel. The sense amplifier SA may change the number of transistors to be operated, among the multiple transistors in the transistor Tr15. For this reason, the sense amplifier SA may change the characteristics of the transistor Tr15 according to the number of transistors to be operated. As a result, the magnitude of the current flowing in the transistor Tr15 may be changed, and the magnitude of the voltage charged in the capacitor C2 may be changed. Therefore, as in the second embodiment and the first modification to the second embodiment, when another reading operation is applied, the magnitude of the voltage charged in the capacitor C2 may be set to an appropriate value. In addition, even when the characteristics are changed by the memory cell MC due to the influence of a manufacturing error, the characteristics of the transistor Tr15 may be changed for each memory cell MC.

The method of changing the characteristics of the transistor Tr15 is not limited to the above-described method. For example, the threshold voltage of the transistor Tr15 may be adjusted by ion implantation during the manufacturing of the semiconductor memory device 1.

3. Others

Each of the above-described example embodiments has been described in connection with a semiconductor memory device using a resistance-variable element. Specifically, the example embodiments were be applied to a semiconductor memory device having an element for storing data by using a resistance-variable such as ReRAM and PCRAM.

Regardless of whether the semiconductor memory is a volatile memory or a nonvolatile memory, the example embodiments may be applied to any semiconductor memory device having an element capable of storing data by a resistance change caused according to a supply of a current or a voltage, or the reading of data stored therein by converting a resistance difference caused by the resistance change into a current difference or voltage difference.

Each of the above-described embodiments has been described in connection with the case in which each memory cell MC is capable of holding two bits (MLC), but is not limited thereto. For example, the memory cell MC may be capable of holding 1 bit (a single level cell (SLC)), 3 bits (a triple level cell (TLC)), or 4 bits or more. Furthermore, the sense amplifier SA includes comparators COMP of a total number depending on the total number of bits capable of being held by the memory cell MC. For example, when the memory cell MC is capable of holding k bits (where k is a natural number), the sense amplifier SA includes $2^k$ comparators COMP. In addition, the sense amplifier SA may read the data held in the memory cell MC based on $2^k$ signals SAO output from the comparator COMP.

The third modification to the second embodiment has been described in connection with the case in which the transistor Tr15 includes multiple transistors connected in parallel to each other, but such a configuration is also applicable to other transistors and capacitors described in the specification. Specifically, for example, each of the transistors Tr6 and Tr8 in each of the above-described embodiments may comprise multiple transistors connected in parallel to each other. Further, for example, each of the capacitors C1 and C2 in each of the above-described exemplary embodiments may comprise multiple capacitors connected in parallel to each other. By this method, the sense amplifier SA may change the characteristics of the transistors Tr6 and Tr8 and the capacitors C1 and C2 according to the number of transistors and capacitors to be operated. As a result, the magnitude of the current flowing in the transistors Tr6 and Tr8 and the amount of charges accumulated in the capacitors C1 and C2 may be changed. Therefore, even if the characteristics are changed by the memory cells MC due to the influence of a manufacturing error or the like, the voltage input to the comparator COMP for each memory cell MC may be set to an appropriate value.

While certain example embodiments have been described, these have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
   a first memory cell having a first end electrically connected to a first wiring and a second end electrically connected to a second wiring;
   a second memory cell having a first end electrically connected to the first wiring and a second end electrically connected to a third wiring; and
   a sense amplifier configured to:
      sense a first current flowing in the first wiring when a first voltage is applied to the second and third wirings and a second voltage, larger than the first voltage, is applied to the first wiring,
      sense a second current flowing in the first wiring when a third voltage, larger than the second voltage, is applied to the first wiring, the first voltage is applied to the second wiring, and the second voltage is applied to the third wiring, and
      read data from the first memory cell according to a difference between the first current and the second current.

2. The semiconductor memory device according to claim 1, further comprising:
   a third memory cell;
   a first transistor having a first end electrically connected to the first wiring and a second end electrically connected to the first end of the first memory cell and the first end of the second memory cell; and
   a second transistor having a first end electrically connected to the first wiring and a second end electrically connected to a first end of the third memory cell, wherein the sense amplifier is configured to sense the first current and the second current when the first transistor is in an on state and the second transistor is in an off state.

3. The semiconductor memory device according to claim 1, further comprising:
a fourth memory cell having a first end electrically connected to a fourth wiring and a second end electrically connected to one of the second wiring or the third wiring, wherein
the sense amplifier is configured to:
sense the first current when the first voltage is applied to the fourth wiring; and
sense the second current when the second voltage is applied to the fourth wiring.

4. The semiconductor memory device according to claim 1, further comprising:
a fourth memory cell having a first end electrically connected to a fourth wiring and a second end electrically connected to one of the second wiring or the third wiring, wherein
the sense amplifier is configured to sense the first current and the second current when the first voltage is applied to the fourth wiring.

5. The semiconductor memory device according to claim 1, wherein the sense amplifier includes:
a first current mirror circuit having a first end electrically connected to the first wiring;
a first capacitor and a second capacitor, each including a first end electrically connected to a second end of the first current mirror circuit;
a third transistor having a gate node electrically connected to the first end of the first capacitor;
a fourth transistor having a gate node electrically connected to the first end of the second capacitor;
a second current mirror circuit having a first end electrically connected to a first end of the fourth transistor and a second end electrically connected to a first end of the third transistor; and
a third capacitor having a first end electrically connected to the first end of the third transistor and the second end of the second current mirror circuit.

6. The semiconductor memory device according to claim 5, wherein the sense amplifier further includes:
a fifth transistor having a first end electrically connected to the second end of the first current mirror circuit and a second end electrically connected to the first end of the first capacitor; and
a sixth transistor having a first end electrically connected to the second end of the first current mirror circuit and the first end of the fifth transistor and a second end electrically connected to the first end of the second capacitor.

7. The semiconductor memory device according to claim 6, wherein the sense amplifier is configured to:
place the fifth transistor into an on state and the sixth transistor into an off state when sensing the first current; and
place the fifth transistor into an off state and the sixth transistor into an on state when sensing the second current.

8. The semiconductor memory device according to claim 5, wherein the sense amplifier further includes:
a first comparator having a first input electrically connected to the first end of the third capacitor and a second input to which a fourth voltage is applied.

9. The semiconductor memory device according to claim 8, wherein the sense amplifier further includes:

N second comparators, where N is an integer equal to or greater than 1, each second comparator having a first input electrically connected to the first end of the third capacitor and a second input to which a voltage different from the fourth voltage is applied, and
the voltages applied to each respective second input of the N second comparators have different magnitudes.

10. The semiconductor memory device according to claim 1, wherein the sense amplifier includes:
a first current mirror circuit having a first end electrically connected to the first wiring;
a first capacitor and a second capacitor, each having a first end electrically connected to a second end of the first current mirror circuit; and
a third transistor having a gate node electrically connected to the first end of the first capacitor and a first end electrically connected to the second end of the first current mirror circuit and the first end of the second capacitor.

11. The semiconductor memory device according to claim 10, wherein the sense amplifier further includes:
a fourth transistor having a first end electrically connected to the second end of the first current mirror circuit and a second end electrically connected to the first end of the first capacitor; and
a fifth transistor including a first end electrically connected to the second end of the first current mirror circuit and the first end of the fourth transistor and a second end electrically connected to the first end of the second capacitor and the first end of the third transistor.

12. The semiconductor memory device according to claim 11, wherein the sense amplifier is configured to:
place the fourth transistor into an on state and the fifth transistor into an off state when sensing the first current; and
place the fourth transistor into an off state and the fifth transistor into an on state when sensing the second current.

13. The semiconductor memory device according to claim 11, wherein the sense amplifier is configured to:
place the fourth transistor into an off state and the fifth transistor into an on state when sensing the first current; and
place the fourth transistor into an on state and the fifth transistor into an off state when sensing the second current.

14. The semiconductor memory device according to claim 10, wherein the sense amplifier further includes:
a first comparator having a first input electrically connected with the first end of the second capacitor and a second input to which the fourth voltage is applied.

15. The semiconductor memory device according to claim 14, wherein the sense amplifier further includes:
N second comparators, where N is an integer equal to or greater than 1, each second comparator having a first input electrically connected to the first end of the second capacitor and a second input to which a voltage different from the fourth voltage is applied, and
the voltages applied to each respective second input of the N second comparators have different magnitudes.

16. The semiconductor memory device according to claim 10, wherein the third transistor comprises a plurality of transistors which are connected to each other in parallel.

17. The semiconductor memory device according to claim 16, wherein the sense amplifier is configured to vary the number of transistors in the plurality of transistors comprising the third transistor brought into an on state when sensing the second current according to a memory cell reading data.

18. The semiconductor memory device according to claim 1, wherein the second voltage has an intermediate value between the first voltage and the third voltage.

19. The semiconductor memory device according to claim 1, wherein the sense amplifier is configured to sense the second current after sensing the first current.

20. The semiconductor memory device according to claim 1, wherein the sense amplifier is configured to sense the first current after sensing the second current.

* * * * *